(12) United States Patent
Foland

(10) Patent No.: US 12,263,753 B2
(45) Date of Patent: Apr. 1, 2025

(54) SYSTEM AND METHOD FOR ENERGY TRACKING IN AN ELECTRIC AIRCRAFT

(71) Applicant: BETA AIR LLC, South Burlington, VT (US)

(72) Inventor: Steven J. Foland, Garland, TX (US)

(73) Assignee: BETA AIR LLC, South Burlington, VT (US)

( * ) Notice: Subject to any disclaimer, the term of this patent is extended or adjusted under 35 U.S.C. 154(b) by 154 days.

(21) Appl. No.: 18/090,370

(22) Filed: Dec. 28, 2022

(65) Prior Publication Data

US 2023/0347784 A1   Nov. 2, 2023

Related U.S. Application Data

(63) Continuation of application No. 17/732,680, filed on Apr. 29, 2022, now Pat. No. 11,584,254.

(51) Int. Cl.
*B60L 58/10* (2019.01)
*G01R 31/00* (2006.01)
(Continued)

(52) U.S. Cl.
CPC ............ *B60L 58/10* (2019.02); *G01R 31/008* (2013.01); *G01R 31/382* (2019.01);
(Continued)

(58) Field of Classification Search
USPC ......................................... 324/426, 433–435
See application file for complete search history.

(56) References Cited

U.S. PATENT DOCUMENTS

| 5,349,535 A | 9/1994 | Gupta |
| 8,258,747 B2 | 9/2012 | Andres et al. |

(Continued)

FOREIGN PATENT DOCUMENTS

| CN | 203572935 U | 4/2014 |
| WO | 2021059294 | 4/2021 |

OTHER PUBLICATIONS

Markus Lelie 1,2,*,†, Thomas Braun 1,2, †,MARCUS KNIPS 1,2,†,HANNES NORDMANN 1,2,†,FLORIAN Ringbeck 1,2,†Orcid,Hendrik Zappen 1,2,†Anddirk Uwe Sauer , Battery Management System Hardware Concepts: An Overview, Mar. 30, 2018.

(Continued)

*Primary Examiner* — Vincent Q Nguyen
(74) *Attorney, Agent, or Firm* — Brake Hughes Bellermann LLP

(57) ABSTRACT

In an aspect a system for energy tracking in an electric aircraft. A system includes at least a battery pack. At least a battery pack includes a plurality of battery modules. A system includes a sensing device. A sensing device is configured to detect a battery parameter of at least a battery module of a plurality of battery modules. A sensing device is configured to generate battery data as a function of a detected battery parameter of at least a battery module. A system includes a computing device. A computing device is in electronic communication with a sensing device. A computing device is configured to receive battery data from a sensing device. A computing device is configured to determine an energy amount of a plurality of battery packs as a function of battery data.

16 Claims, 13 Drawing Sheets

(51) Int. Cl.
*G01R 31/382* (2019.01)
*G01R 31/396* (2019.01)
*G08G 5/00* (2006.01)

(52) U.S. Cl.
CPC ......... *G01R 31/396* (2019.01); *G08G 5/0034* (2013.01); *B60L 2200/10* (2013.01)

(56) References Cited

U.S. PATENT DOCUMENTS

| | | | |
|---|---|---|---|
| 9,647,301 | B2 | 5/2017 | Mizobe et al. |
| 10,389,141 | B2 | 8/2019 | Roumi et al. |
| 10,991,994 | B2 | 4/2021 | Cho et al. |
| 11,065,979 | B1 | 7/2021 | Demont et al. |
| 11,133,534 | B2 | 9/2021 | Kirleis et al. |
| 11,449,078 | B1 | 9/2022 | Freiheit |
| 2009/0206841 | A1 | 8/2009 | Weng |
| 2013/0200856 | A1* | 8/2013 | Zhang ............... B60L 58/18 320/150 |
| 2015/0280294 | A1* | 10/2015 | Shin ............... B60L 58/26 429/50 |
| 2017/0345101 | A1 | 11/2017 | Beaston |
| 2018/0257780 | A1* | 9/2018 | Sassinsky ............... B64D 7/00 |
| 2018/0278066 | A1 | 9/2018 | Kurahashi et al. |
| 2020/0227925 | A1 | 7/2020 | Park |
| 2020/0277080 | A1* | 9/2020 | Wiegman ............... B60L 50/60 |
| 2020/0348744 | A1 | 11/2020 | Rabii et al. |
| 2021/0141043 | A1 | 5/2021 | Bertness |
| 2021/0288356 | A1 | 9/2021 | Tsutsui et al. |
| 2021/0370792 | A1 | 12/2021 | Sato |

OTHER PUBLICATIONS

Seyed Reza Hashemi, Afsoon Bahadoran Baghbadorani, Roja Esmaeeli, Ajay Mahajan, Siamak Farhad, Machine learning-based model for lithium-ion batteries in BMS of electric/hybrid electric aircraft, Nov. 16, 2020.

Hossam A. Gabbar *, Ahmed M. Othman and Muhammad R. Abdussami, Review of Battery Management Systems (BMS) Development and Industrial Standards, Apr. 11, 2021.

Yunqiang Hao , 1 Dongbai Yi,2 Xiaowei Zhang , 1 Wenxin Yu, 1 Jianxiong Xi,1 and Lenian He, A Power Management IC Used for Monitoring and Protection of Li-Ion Battery Packs, Apr. 9, 2021.

* cited by examiner

SYSTEM AND METHOD FOR ENERGY TRACKING IN AN ELECTRIC AIRCRAFT

CROSS-REFERENCE TO RELATED APPLICATIONS

This application is a continuation of Non-provisional application Ser. No. 17/732,680 filed on Apr. 29, 2022 and entitled "SYSTEM AND METHOD FOR ENERGY TRACKING IN AN ELECTRIC AIRCRAFT," the entirety of which is incorporated herein by reference.

FIELD OF THE INVENTION

The present invention generally relates to the field of energy tracking. In particular, the present invention is directed to systems and methods for energy tracking in an electric aircraft.

BACKGROUND

Electric aircrafts require electrical energy to operate, usually in the form of batteries. However, modern systems and methods of accurately measuring battery levels of electric aircrafts are inefficient. As such, modern systems and methods of energy tracking in an electric aircraft can be improved.

SUMMARY OF THE DISCLOSURE

In an aspect a system for energy tracking in an electric aircraft. A system includes at least a battery pack. At least a battery pack includes a plurality of battery modules. A system includes a sensing device. The sensing device is configured to detect a battery parameter of at least a battery module of a plurality of battery modules. The sensing device is configured to generate battery data as a function of a detected battery parameter of at least a battery module. The system includes a computing device communicatively connected to a sensing device. The computing device is configured to receive battery data from a sensing device. The computing device is configured to determine a power distribution of the at least a battery module, wherein determining the power distribution comprises determining whether the at least a battery module is generating power at an uneven rate compared to the plurality of battery modules.

In another aspect a method of energy tracking in an electric aircraft is presented. The method includes sensing, through a sensing device of an electric aircraft, a battery parameter of at least a battery module of a plurality of battery modules. The method includes generating, through a sensing device, battery data as a function of a detected battery parameter of the at least a battery module. The method includes receiving, at a computing device of an electric aircraft, battery data from a sensing device. The method includes determining, by the computing device, a power distribution of the at least a battery module, wherein determining the power distribution comprises determining whether the at least a battery module is generating power at an uneven rate compared to the plurality of battery modules.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

Described herein is a system for energy tracking in an electric aircraft. A system may include at least a battery pack. At least a battery pack may include a plurality of battery modules. A system may include a sensing device. A sensing device may be configured to detect a battery parameter of at least a battery module of a plurality of battery modules. A sensing device may be configured to generate battery data as a function of a detected battery parameter of at least a battery module. A system may include a computing device. A computing device may be in electronic communication with a sensing device. A computing device may be configured to receive battery data from a sensing device. A computing device may be configured to determine an energy amount of a plurality of battery packs as a function of battery data.

Described herein is a method of energy tracking in an electric aircraft. A method may include sensing, through a sensing device of an electric vehicle, a battery parameter of at least a battery module of a plurality of battery modules. A method may include generating, through a sensing device, battery data as a function of a detected battery parameter of the at least a battery module. A method may include receiving, at a computing device of an electric vehicle, battery data from a sensing device. A method may include determining, at the computing device, an energy amount of at least a battery module of a plurality of battery modules as a function of received battery data.

Figure 1:
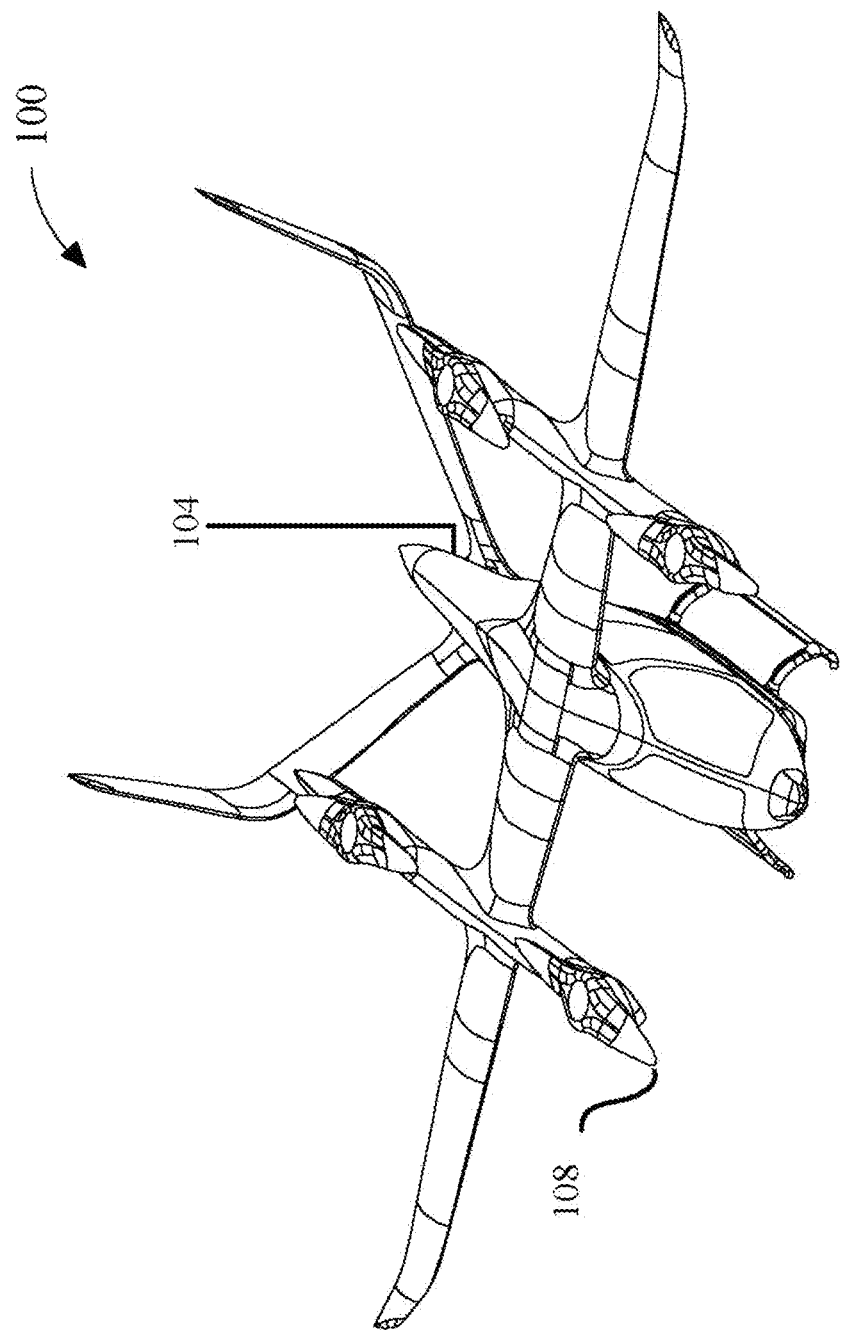
FIG. 1 is an illustration of an embodiment of an electric aircraft.

Referring now to FIG. 1, an embodiment of an electric aircraft 100 is presented. Still referring to FIG. 1, electric aircraft 100 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

With continued reference to FIG. 1, a number of aerodynamic forces may act upon the electric aircraft 100 during flight. Forces acting on an electric aircraft 100 during flight may include, without limitation, thrust, the forward force produced by the rotating element of the electric aircraft 100 and acts parallel to the longitudinal axis. Another force acting upon electric aircraft 100 may be, without limitation, drag, which may be defined as a rearward retarding force which is caused by disruption of airflow by any protruding surface of the electric aircraft 100 such as, without limitation, the wing, rotor, and fuselage. Drag may oppose thrust and acts rearward parallel to the relative wind. A further force acting upon electric aircraft 100 may include, without limitation, weight, which may include a combined load of the electric aircraft 100 itself, crew, baggage, and/or fuel. Weight may pull electric aircraft 100 downward due to the force of gravity. An additional force acting on electric aircraft 100 may include, without limitation, lift, which may act to oppose the downward force of weight and may be produced by the dynamic effect of air acting on the airfoil and/or downward thrust from the propulsor of the electric aircraft. Lift generated by the airfoil may depend on speed of airflow, density of air, total area of an airfoil and/or segment thereof, and/or an angle of attack between air and the airfoil. For example, and without limitation, electric aircraft 100 are designed to be as lightweight as possible. Reducing the weight of the aircraft and designing to reduce the number of components is essential to optimize the weight. To save energy, it may be useful to reduce weight of components of an electric aircraft 100, including without limitation propulsors and/or propulsion assemblies. In an embodiment, the motor may eliminate need for many external structural features that otherwise might be needed to join one component to another component. The motor may also increase energy efficiency by enabling a lower physical propulsor profile, reducing drag and/or wind resistance. This may also increase durability by lessening the extent to which drag and/or wind resistance add to forces acting on electric aircraft 100 and/or propulsors.

Referring still to FIG. 1, electric aircraft 100 may include at least a vertical propulsor 104 and at least a forward propulsor 108. A forward propulsor is a propulsor that propels the aircraft in a forward direction. Forward in this context is not an indication of the propulsor position on the aircraft; one or more propulsors mounted on the front, on the wings, at the rear, etc. A vertical propulsor is a propulsor that propels the aircraft in an upward direction; one or more vertical propulsors may be mounted on the front, on the wings, at the rear, and/or any suitable location. A propulsor, as used herein, is a component or device used to propel a craft by exerting force on a fluid medium, which may include a gaseous medium such as air or a liquid medium such as water. At least a vertical propulsor 104 is a propulsor that generates a substantially downward thrust, tending to propel an aircraft in a vertical direction providing thrust for maneuvers such as without limitation, vertical take-off, vertical landing, hovering, and/or rotor-based flight such as "quadcopter" or similar styles of flight.

With continued reference to FIG. 1, at least a forward propulsor 108 as used in this disclosure is a propulsor positioned for propelling an aircraft in a "forward" direction; at least a forward propulsor may include one or more propulsors mounted on the front, on the wings, at the rear, or a combination of any such positions. At least a forward propulsor may propel an aircraft forward for fixed-wing and/or "airplane"-style flight, takeoff, and/or landing, and/or may propel the aircraft forward or backward on the ground. At least a vertical propulsor 104 and at least a forward propulsor 108 includes a thrust element. At least a thrust element may include any device or component that converts the mechanical energy of a motor, for instance in the form of rotational motion of a shaft, into thrust in a fluid medium. At least a thrust element may include, without limitation, a device using moving or rotating foils, including without limitation one or more rotors, an airscrew or propeller, a set of airscrews or propellers such as contrarotating propellers, a moving or flapping wing, or the like. At least a thrust element may include without limitation a marine propeller or screw, an impeller, a turbine, a pump-jet, a paddle or paddle-based device, or the like. As another non-limiting example, at least a thrust element may include an eight-bladed pusher propeller, such as an eight-bladed propeller mounted behind the engine to ensure the drive shaft is in compression. Propulsors may include at least a motor mechanically coupled to the at least a first propulsor as a source of thrust. A motor may include without limitation, any electric motor, where an electric motor is a device that converts electrical energy into mechanical energy, for instance by causing a shaft to rotate. At least a motor may be driven by direct current (DC) electric power; for instance, at least a first motor may include a brushed DC at least a first motor, or the like. At least a first motor may be driven by electric power having varying or reversing voltage levels, such as alternating current (AC) power as produced by an alternating current generator and/or inverter, or otherwise varying power, such as produced by a switching power source. At least a first motor may include, without limitation, brushless DC electric motors, permanent magnet synchronous at least a first motor, switched reluctance motors, or induction motors. In addition to inverter and/or a switching power source, a circuit driving at least a first motor may include electronic speed controllers or other components for regulating motor speed, rotation direction, and/or dynamic braking. Persons skilled in the art, upon reviewing the entirety of this disclosure, will be aware of various devices that may be used as at least a thrust element.

With continued reference to FIG. 1, during flight, a number of forces may act upon the electric aircraft. Forces acting on an aircraft 100 during flight may include thrust, the forward force produced by the rotating element of the aircraft 100 and acts parallel to the longitudinal axis. Drag may be defined as a rearward retarding force which is caused by disruption of airflow by any protruding surface of the aircraft 100 such as, without limitation, the wing, rotor, and fuselage. Drag may oppose thrust and acts rearward parallel to the relative wind. Another force acting on aircraft 100 may include weight, which may include a combined load of the aircraft 100 itself, crew, baggage and fuel. Weight may pull aircraft 100 downward due to the force of gravity. An additional force acting on aircraft 100 may include lift, which may act to oppose the downward force of weight and may be produced by the dynamic effect of air acting on the airfoil and/or downward thrust from at least a propulsor. Lift generated by the airfoil may depends on speed of airflow, density of air, total area of an airfoil and/or segment thereof, and/or an angle of attack between air and the airfoil.

Figure 2:
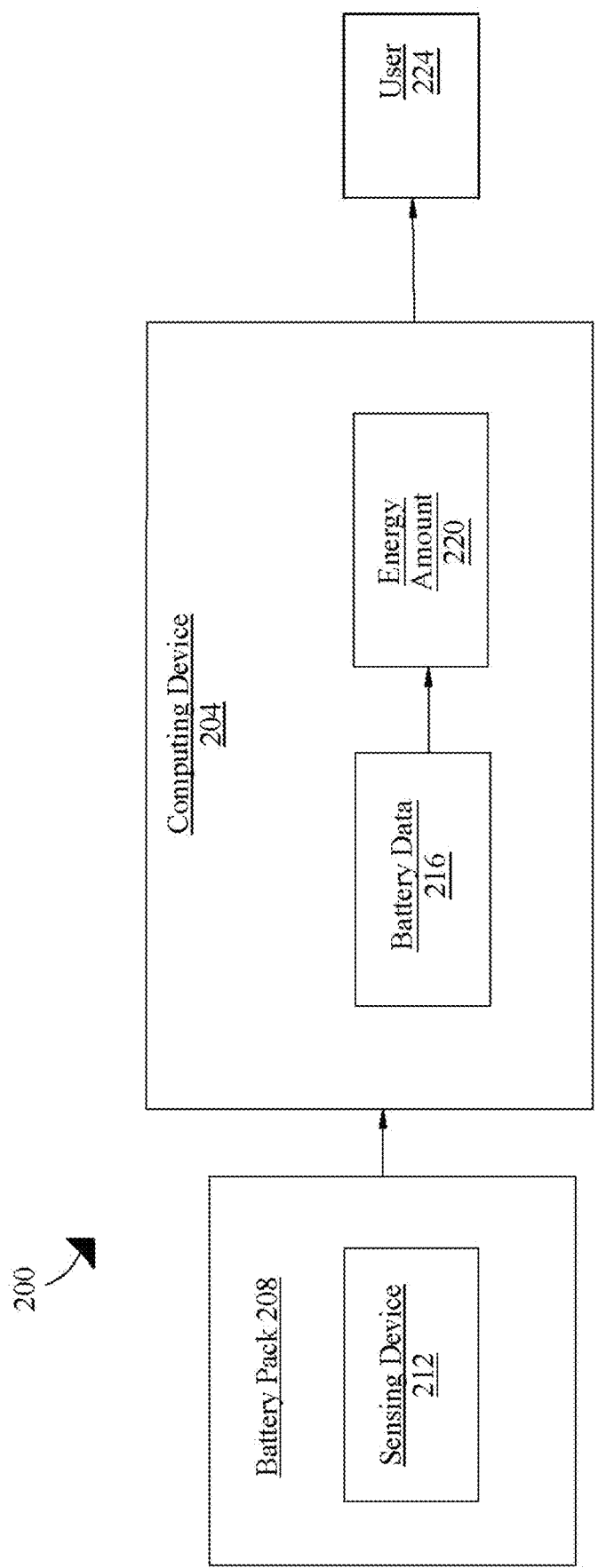
FIG. 2 a system for energy tracking in an electric aircraft.

Referring now to FIG. 2, an exemplary embodiment of a system 200 for energy tracking in an electric vehicle is illustrated. System 200 may include computing device 204. Computing device 204 may include any computing device as described in this disclosure, including without limitation a microcontroller, microprocessor, digital signal processor (DSP) and/or system on a chip (SoC) as described in this disclosure. Computing device 204 may include, be included in, and/or communicate with a mobile device such as a mobile telephone or smartphone. Computing device 204 may include a single computing device operating independently, or may include two or more computing device operating in concert, in parallel, sequentially or the like; two or more computing devices may be included together in a single computing device or in two or more computing devices. Computing device 204 may interface or communicate with one or more additional devices as described below in further detail via a network interface device. Network interface device may be utilized for connecting computing device 204 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device may include but is not limited to, for example, a computing device or cluster of computing devices in a first location and a second computing device or cluster of computing devices in a second location. Computing device 204 may include one or more computing devices dedicated to data storage, security, distribution of traffic for load balancing, and the like. Computing device 204 may distribute one or more computing tasks as described below across a plurality of computing devices of computing device, which may operate in parallel, in series, redundantly, or in any other manner used for distribution of tasks or memory between computing devices. Computing device 204 may be implemented using a "shared nothing" architecture in which data is cached at the worker, in an embodiment, this may enable scalability of system 200 and/or computing device 204. In some embodiments, computing device 204 may include a flight controller as described below in FIG. 3.

With continued reference to FIG. 2, computing device 204 may be designed and/or configured to perform any method, method step, or sequence of method steps in any embodiment described in this disclosure, in any order and with any degree of repetition. For instance, computing device 204 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device 204 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Referring still to FIG. 2, system 200 for energy tracking in an electric vehicle is presented. System 200 may include computing device 204. Computing device 204 may be configured to receive battery data 216 from sensing device 212. Sensing device 212 may include one or more sensors that may be configured to detect a battery parameter of battery pack 208. A "battery parameter" as used in this disclosure is any metric associated with a battery pack. Battery pack 208 may include two or more battery modules. Battery pack 208 may include one or more electromechanical cells. Battery pack 208 may be described in further detail below with reference to FIG. 4. Sensing device 212 may be described in further detail below with reference to FIG. 3.

Still referring to FIG. 2, sensing device 212 may be configured to detect one or more battery parameters, such as, but not limited to, temperature, voltage, current, power output, battery capacity, run time, and the like. Sensing device 212 may be configured to generate battery data 216 as a function of detected battery parameters. Battery data 216 may include, but is not limited to, voltage, current, power distribution, resistance, temperature, battery capacity, and the like. In some embodiments, computing device 204 may be configured to determine one or more metrics of battery pack 208. Computing device 204 may determine, as a function of battery data 216, energy amount 220. Energy amount 220 may include energy metrics, such as, but not limited to, wattages, ampere hours, and the like. Energy amount 220 may include a ratio of a current energy amount to a total energy capacity. A "total energy capacity" as used in this disclosure is a sum amount of energy a device can store. As a non-limiting example, a ratio may show that battery pack 208 is ¾ or 75% charged. In some embodiments, energy amount 220 may include a remaining energy amount. Computing device 204 may use energy amount 220 to determine other metrics of battery pack 208, such as, but not limited to, battery health, battery degradation, battery charge times, battery discharge times, and the like. Battery health may include a health state. A "health state" as used in this disclosure is a level of degradation of an electric device. In some embodiments, computing device 204 may determine a state of charge of a battery, state of health of a battery, remaining flight time, remaining hover time and the like as described in U.S. patent application Ser. No. 17/349,182, filed Jun. 16, 2021, and titled "SYSTEMS AND METHODS FOR IN-FLIGHT OPERATIONAL ASSESSMENT," which is incorporated by reference herein in their entirety.

Still referring to FIG. 2, computing device 204 may be configured to determine an energy anomaly of battery pack 208. An "energy anomaly" as used in this disclosure is any metric corresponding to an abnormal energy reading. An energy anomaly may include, but is not limited to, voltage spikes, reduced battery capacity, current spikes, voltage drops, current drops, increased power output, decreased power output, and the like. In some embodiments, computing device 204 may determine a power distribution of battery pack 208. A "power distribution" as used in this disclosure is any dispersal of electric energy. In some embodiments, a power distribution may show that one or more battery modules of battery pack 208 are generating power at an uneven rate compared to one or more other battery modules of battery pack 208. Computing device 204 may compare battery data 216 of one battery pack of a plurality of battery packs to at least another battery pack of the plurality of battery packs. Computing device 204 may compare two or more battery modules of battery pack 208. Comparing two or more battery modules may include, but is not limited to, comparing power outputs, voltages, currents, battery capacities, and the like. In some embodiments, computing device 204 may compare two or more battery packs. Comparing two or more battery packs may include, but is not limited to, comparing thermal energy, voltages, currents, power outputs, power capacities, and the like. Computing device 204 may be configured to predict a remaining battery life of battery pack 208 and/or a battery module of battery pack 208. A "remaining battery life" as used in this disclosure is a period of time until one or more energy devices deplete their energy stores completely. Computing device 204 may utilize an energy machine learning model to predict remaining battery life. An energy machine learning model may be trained on training data that may correlated battery data to remaining battery life. Training data may be received from an external computing device, user input, and/or previous iterations of processing. Computing device 204 may predict battery life of battery pack 208 based on battery data 216. As a non-limiting example, battery data 216 may show that battery pack 208 is outputting 10 kwh of power an hour and has a current capacity of 100 kwh. Computing device 204 may determine battery pack 208 has a remaining battery life of 10 hours. Computing device 204 may determine a remaining battery life of battery pack 208 based on, but not limited to, flight plans, flight maneuvers, speeds, altitude, cargo weight, and the like.

Still referring to FIG. 2, computing device 204 may be configured to generate an energy saving flight plan. An "energy saving flight plan" as used in this disclosure is any step or steps that may reduce an amount of energy consumed by an aircraft. Computing device 204 may use an energy saving machine learning model. In some embodiments, an external computing device may train an energy saving machine learning model and communicate the trained energy saving machine learning model to computing device 204. An energy saving machine learning model may be trained on training data correlating flight path parameters to energy costs. Training data may be received from an external computing device, user input, and/or previous iterations of processing. An energy saving machine learning model may be configured to input flight parameters and output energy saving actions. Computing device 204 may use an energy saving machine learning model to generate an energy saving flight plan. In some embodiments, an energy saving flight plan may be determined based on flight parameters such as, but not limited to, flight speeds, flight maneuvers, cargo weight, flight path, altitudes, and the like. An energy saving flight plan may include, but is not limited to, reducing speeds, dropping off cargo, shutting off air conditioning, shutting off light sources, decreasing altitude, and the like. In some embodiments, computing device 204 may display an energy saving flight plan to user 224 through a graphical user interface (GUI). A GUI may include, but is not limited to, a cockpit display, smartphone display, laptop display, monitor, tablet display, and the like. In some embodiments, computing device 204 may display energy amount 220 and/or battery data 216 to user 224.

Figure 3:
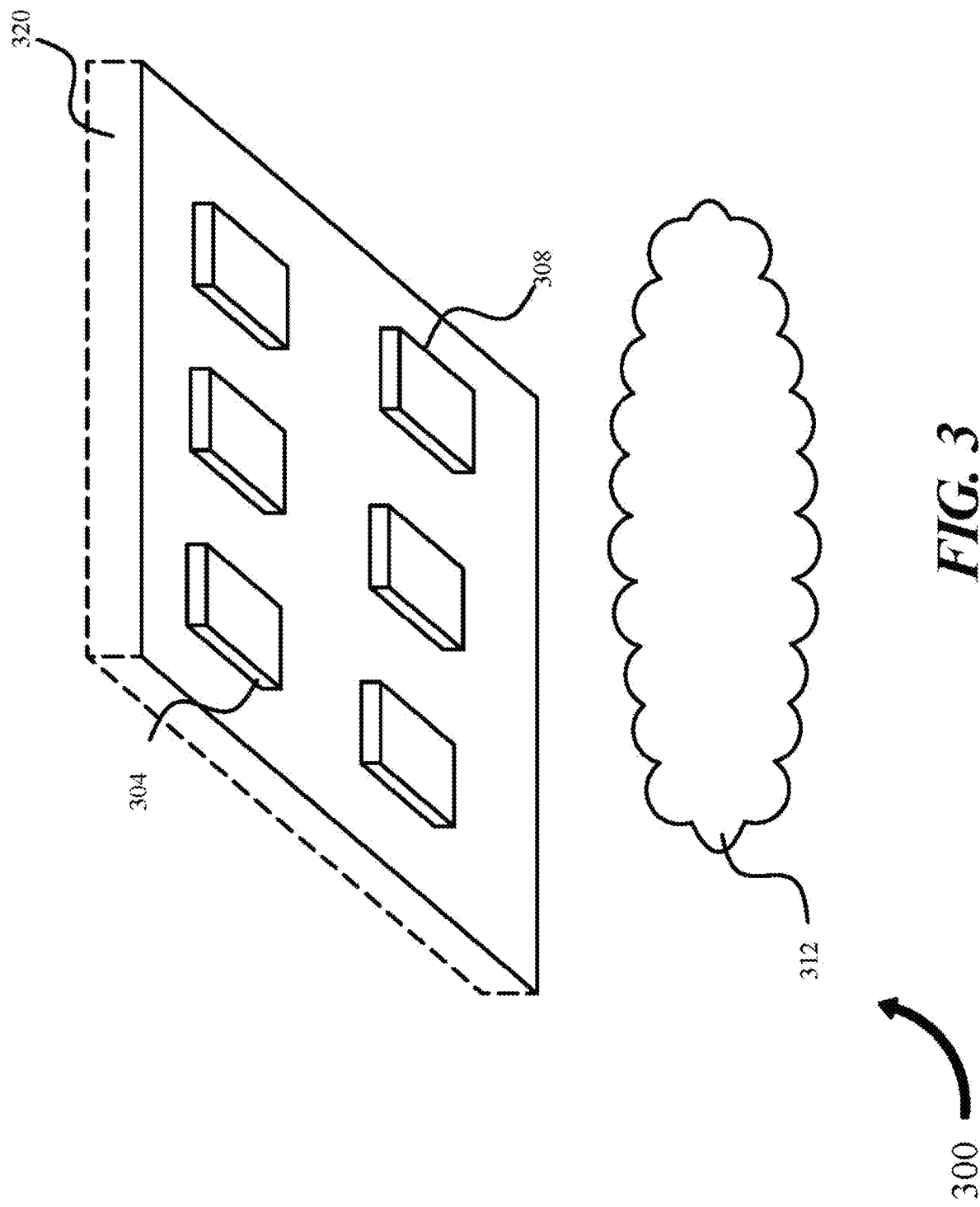
FIG. 3 is an exemplary embodiment of a sensing device.

Referring now to FIG. 3, an embodiment of sensing device 300 is presented. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack 208 measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of energy tracking system 200 and/or user to detect phenomenon is maintained and in a non-limiting example, a user alter aircraft usage pursuant to sensor readings.

Still referring to FIG. 3, sensing device 300 may be suitable for use as sensing device 212 as disclosed with reference to FIG. 2 hereinabove. Sensing device 300 may include a humidity sensor 304. Humidity, as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity," for the purposes of this disclosure, is expressed as a percentage, indicating a present stat of absolute humidity relative to a maximum humidity given the same temperature. "Specific humidity," for the purposes of this disclosure, is the ratio of water vapor mass to total moist air parcel mass, where parcel is a given portion of a gaseous medium. Humidity sensor 304 may be psychrometer. Humidity sensor 304 may be a hygrometer. Humidity sensor 304 may be configured to act as or include a humidistat. A "humidistat," for the purposes of this disclosure, is a humidity-triggered switch, often used to control another electronic device. Humidity sensor 304 may use capacitance to measure relative humidity and include in itself, or as an external component, include a device to convert relative humidity measurements to absolute humidity measurements. "Capacitance," for the purposes of this disclosure, is the ability of a system to store an electric charge, in this case the system is a parcel of air which may be near, adjacent to, or above a battery cell.

With continued reference to FIG. 3, sensing device 300 may include multimeter 308. Multimeter 308 may be configured to measure voltage across a component, electrical current through a component, and resistance of a component. Multimeter 308 may include separate sensors to measure each of the previously disclosed electrical characteristics such as voltmeter, ammeter, and ohmmeter, respectively. Sensing device 300 may include a sensor or plurality thereof that may detect voltage and direct the charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensing device 300 and/or a control circuit incorporated therein and/or communicatively connected thereto may be configured to adjust charge to one or more battery cells as a function of a charge level and/or a detected parameter. For instance, and without limitation, sensing device 300 may be configured to determine that a charge level of a battery cell is high based on a detected voltage level of that battery cell or portion of the battery pack. Sensing device 300 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensing device 300 may include digital sensors, analog sensors, or a combination thereof. Sensing device 300 may include digital-to-analog converters (DAC), analog-to-digital converters (ADC, A/D, A-to-D), a combination thereof, or other signal conditioning components used in transmission of a first plurality of battery pack data to a destination over wireless or wired connection.

With continued reference to FIG. 3, sensing device 300 may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 300, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 3, sensing device 300 may include a sensor configured to detect gas that may be emitted during or after a catastrophic cell failure. "Catastrophic cell failure," for the purposes of this disclosure, refers to a malfunction of a battery cell, which may be an electrochemical cell, which renders the cell inoperable for its designed function, namely providing electrical energy to at least a portion of an electric aircraft. Byproducts of catastrophic cell failure 312 may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 300, may be configured to detect combustible, flammable, toxic, oxygen depleted, a combination thereof, or another type of gas alone or in combination. The gas sensor that may be present in sensor suite 300 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 300 may include sensors that are configured to detect non-gaseous byproducts of catastrophic cell failure 312 including, in non-limiting examples, liquid chemical leaks including aqueous alkaline solution, ionomer, molten phosphoric acid, liquid electrolytes with redox shuttle and ionomer, and salt water, among others. Sensor suite 300 may include sensors that are configured to detect non-gaseous byproducts of catastrophic cell failure 312 including, in non-limiting examples, electrical anomalies as detected by any of the previous disclosed sensors or components.

With continued reference to FIG. 3, sensing device 300 may be configured to detect events where voltage nears an upper voltage threshold or lower voltage threshold. An upper voltage threshold may be stored in a data storage system for comparison with an instant measurement taken by any combination of sensors present within sensing device 300. The upper voltage threshold may be calculated and calibrated based on factors relating to battery cell health, maintenance history, location within battery pack, designed application, and type, among others. Sensing device 300 may measure voltage at an instant, over a period of time, or periodically. Sensing device 300 may be configured to operate at any of these detection modes, switch between modes, or simultaneous measure in more than one mode. First battery management component 320 may detect through sensing device 300 events where voltage nears the lower voltage threshold. The lower voltage threshold may indicate power loss to or from an individual battery cell or portion of the battery pack. First battery management component 320 may detect through sensing device 300 events where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

Figure 4:
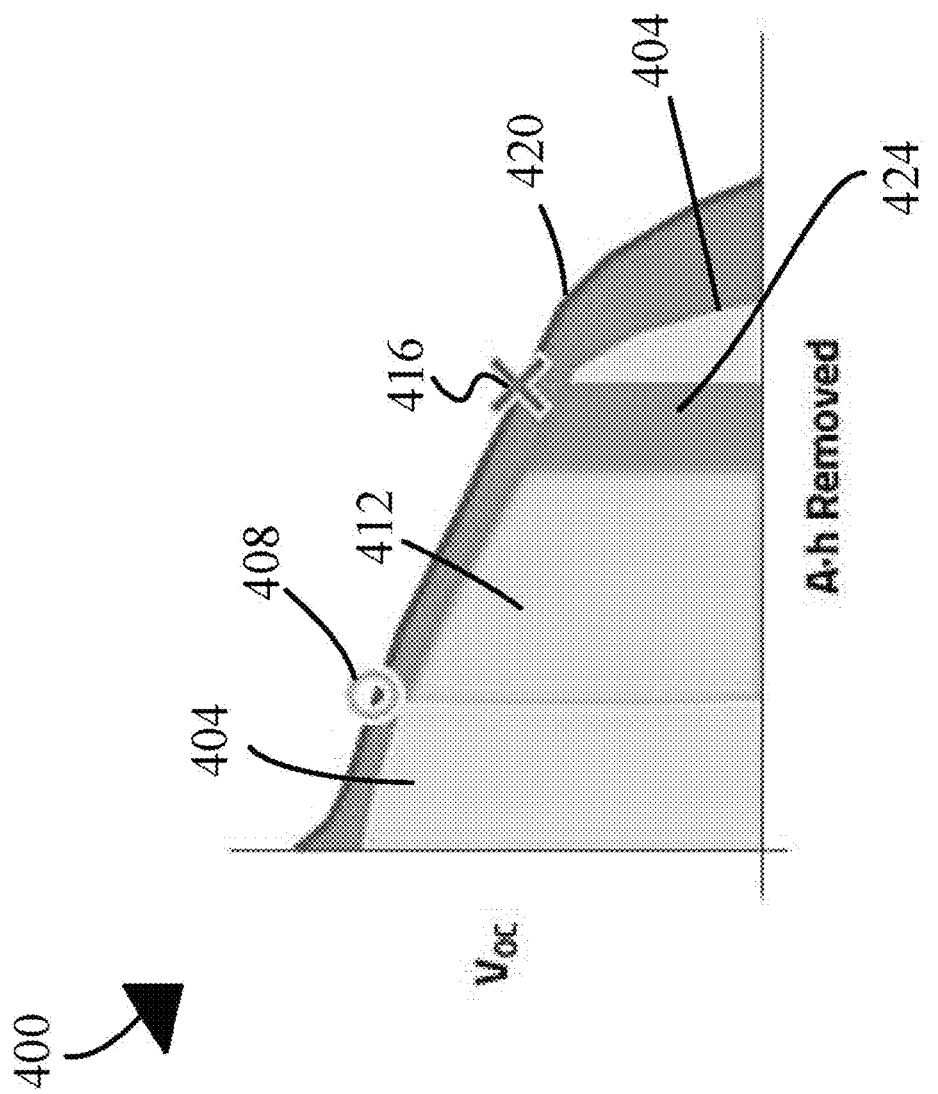
FIG. 4 is an exemplary embodiment of a diagram showing energy tracking metrics.

Referring now to FIG. 4, an exemplary embodiment of graph 400 depicting pack monitoring unit metrics is presented. A pack monitoring unit may measure metrics as shown in graph 400. Graph 400 shows a Y-Axis denoting open circuit voltage, or "Voc". Graph 400 shows an X-Axis denoting ampere hours removed. Ampere hours removed may include an amount of ampere hours left of an energy source. Graph 400 shows potentially usable energy 404. Potentially useable energy 404 may include voltages of one or more battery packs and/or battery units. Graph 400 shows present state 408. Present state 408 may include a current amount of energy out of a total energy amount. A total energy amount may include a total electrochemical energy amount. Graph 400 shows useful energy remaining 412. Useful energy remaining 412 may include an amount of energy remaining to power a current load and/or operation of an electric aircraft. Graph 400 shows terminal condition 416. Terminal condition 416 may include an energy amount that may render an electric aircraft inoperable. Graph 400 shows energy loss 420. Energy loss 420 may include voltage levels over time. Graph 400 shows reserve energy 424. Reserve energy 424 may include stored electrochemical energy of one or more battery packs and/or units that may be reserved for emergency power.

Figure 5:
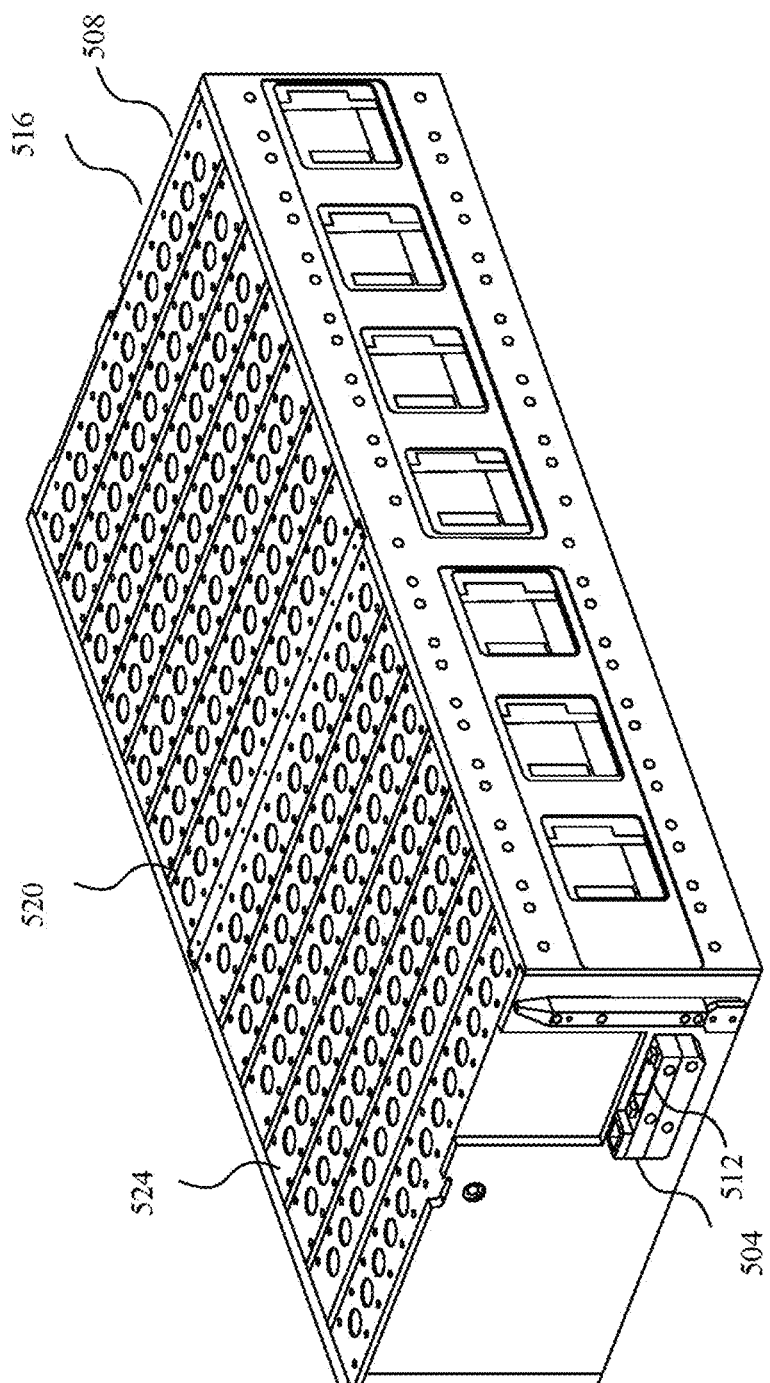
FIG. 5 is an exemplary embodiment of a battery pack.

With reference to FIG. 5, an exemplary embodiment of a battery pack is illustrated. Battery pack 500 may include a power source that may be configured to store electrical energy in the form of a plurality of battery modules, which themselves include of a plurality of electrochemical cells. These cells may utilize electrochemical cells, galvanic cells, electrolytic cells, fuel cells, flow cells, and/or voltaic cells. In general, an electrochemical cell is a device capable of generating electrical energy from chemical reactions or using electrical energy to cause chemical reactions, this disclosure will focus on the former. Voltaic or galvanic cells are electrochemical cells that generate electric current from chemical reactions, while electrolytic cells generate chemical reactions via electrolysis. In general, the term 'battery' is used as a collection of cells connected in series or parallel to each other. A battery cell may, when used in conjunction with other cells, may be electrically connected in series, in parallel or a combination of series and parallel. Series connection includes wiring a first terminal of a first cell to a second terminal of a second cell and further configured to include a single conductive path for electricity to flow while maintaining the same current (measured in Amperes) through any component in the circuit. A battery cell may use the term 'wired,' but one of ordinary skill in the art would appreciate that this term is synonymous with 'electrically connected,' and that there are many ways to couple electrical elements like battery cells together. An example of a connector that does not include wires may be prefabricated terminals of a first gender that mate with a second terminal with a second gender. Battery cells may be wired in parallel. Parallel connection includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, battery pack 500 may include 196 battery cells in series and 18 battery cells in parallel. This is, as someone of ordinary skill in the art would appreciate, is only an example and battery pack 500 may be configured to have a near limitless arrangement of battery cell configurations.

With continued reference to FIG. 5, battery pack 500 may include a plurality of battery modules. The battery modules may be wired together in series and/or in parallel. Battery pack 500 may include a center sheet which may include a thin barrier. The barrier may include a fuse connecting battery modules on either side of the center sheet. The fuse may be disposed in or on the center sheet and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may include a thermal fuse, mechanical fuse, blade fuse, expulsion fuse, spark gap surge arrestor, varistor, or a combination thereof. Battery pack 500 may also include a side wall includes a laminate of a plurality of layers configured to thermally insulate the plurality of battery modules from external components of battery pack 500. The side wall layers may include materials which possess characteristics suitable for thermal insulation as described in the entirety of this disclosure like fiberglass, air, iron fibers, polystyrene foam, and thin plastic films, to name a few. The side wall may additionally or alternatively electrically insulate the plurality of battery modules from external components of battery pack 500 and the layers of which may include polyvinyl chloride (PVC), glass, asbestos, rigid laminate, varnish, resin, paper, Teflon, rubber, and mechanical lamina. The center sheet may be mechanically coupled to the side wall in any manner described in the entirety of this disclosure or otherwise undisclosed methods, alone or in combination. The side wall may include a feature for alignment and coupling to the center sheet. This feature may include a cutout, slots, holes, bosses, ridges, channels, and/or other undisclosed mechanical features, alone or in combination.

With continued reference to FIG. 5, battery pack 500 may also include an end panel including a plurality of electrical connectors and further configured to fix battery pack 500 in alignment with at least the side wall. The end panel may include a plurality of electrical connectors of a first gender configured to electrically and mechanically couple to electrical connectors of a second gender. The end panel may be configured to convey electrical energy from battery cells to at least a portion of an eVTOL aircraft. Electrical energy may be configured to power at least a portion of an eVTOL aircraft or include signals to notify aircraft computers, personnel, users, pilots, and any others of information regarding battery health, emergencies, and/or electrical characteristics. The plurality of electrical connectors may include blind mate connectors, plug and socket connectors, screw terminals, ring and spade connectors, blade connectors, and/or an undisclosed type alone or in combination. The electrical connectors of which the end panel includes may be configured for power and communication purposes. A first end of the end panel may be configured to mechanically couple to a first end of a first side wall by a snap attachment mechanism, similar to end cap and side panel configuration utilized in the battery module. To reiterate, a protrusion disposed in or on the end panel may be captured, at least in part, by a receptacle disposed in or on the side wall. A second end of end the panel may be mechanically coupled to a second end of a second side wall in a similar or the same mechanism.

With continued reference to FIG. 5, sensing device 300 may be disposed in or on a portion of battery pack 500 near battery modules or battery cells. In some embodiments, first sensor suite may be disposed in or on a first portion of battery pack 500 and second sensor suite may be disposed in or on a second portion of battery pack 500. Battery pack 500 may include first high voltage front end 504 disposed on a first end of battery pack 500. First high voltage front end 504 may be configured to communicate with a flight controller using a controller area network (CAN). Controller area network may include bus 512. Bus 512 may include an electrical bus. "Bus," for the purposes of this disclosure and in electrical parlance is any common connection to which any number of loads, which may be connected in parallel, and share a relatively similar voltage may be electrically coupled. Bus may refer to power busses, audio busses, video busses, computing address busses, and/or data busses. Bus 512 may be responsible for conveying electrical energy stored in battery pack 500 to at least a portion of an electric aircraft. Bus 512 may be additionally or alternatively responsible for conveying electrical signals generated by any number of components within battery pack 500 to any destination on or offboard an electric aircraft. First high voltage front end 504 may comprise wiring or conductive surfaces only in portions required to electrically couple bus 512 to electrical power or necessary circuits to convey that power or signals to their destinations. Outputs from sensors or any other component present within system may be analog or digital. Onboard or remotely located processors can convert those output signals from sensor suite to a usable form by the destination of those signals. The usable form of output signals from sensors, through processor may be either digital, analog, a combination thereof or an otherwise unstated form. Processing may be configured to trim, offset, or otherwise compensate the outputs of sensor suite. Based on sensor output, the processor can determine the output to send to downstream component. Processor can include signal amplification, operational amplifier (OpAmp), filter, digital/analog conversion, linearization circuit, current-voltage change circuits, resistance change circuits such as Wheatstone Bridge, an error compensator circuit, a combination thereof or otherwise undisclosed components.

With continued reference to FIG. 5, battery pack 500 may include second high voltage front end 508 disposed on a second end of battery pack 500. Second high voltage front end 508 may be configured to communicate with a flight controller by utilizing a controller area network (CAN). Second high voltage front end 508 may include second bus 516. Second bus 516 may include power busses, audio busses, video busses, computing address busses, and/or data busses. Bus 512 may be responsible for conveying electrical energy stored in battery pack 500 to at least a portion of an electric aircraft. Bus 512 may be additionally or alternatively responsible for conveying electrical signals generated by any number of components within battery pack 500 to any destination on or offboard an electric aircraft. Second high voltage front end 508 may comprise wiring or conductive surfaces only in portions required to electrically couple bus 512 to electrical power or necessary circuits to convey that power or signals to their destinations.

With continued reference to FIG. 5, any of the disclosed components or systems, namely battery pack 500, battery module sense board 520, and/or battery cells may incorporate provisions to dissipate heat energy present due to electrical resistance in integral circuit. Battery pack 500 may include one or more battery element modules wired in series and/or parallel. The presence of a voltage difference and associated amperage inevitably will increase heat energy present in and around battery pack 500 as a whole. The presence of heat energy in a power system is potentially dangerous by introducing energy possibly sufficient to damage mechanical, electrical, and/or other systems present in at least a portion of exemplary aircraft 100. Battery pack 500 may include mechanical design elements, one of ordinary skill in the art, may thermodynamically dissipate heat energy away from battery pack 500. The mechanical design may include, but is not limited to, slots, fins, heat sinks, perforations, a combination thereof, or another undisclosed element.

Still referring to FIG. 5, heat dissipation may include material selection beneficial to move heat energy in a suitable manner for operation of battery pack 500. Certain materials with specific atomic structures and therefore specific elemental or alloyed properties and characteristics may be selected in construction of battery pack 500 to transfer heat energy out of a vulnerable location or selected to withstand certain levels of heat energy output that may potentially damage an otherwise unprotected component. One of ordinary skill in the art, after reading the entirety of this disclosure would understand that material selection may include titanium, steel alloys, nickel, copper, nickel-copper alloys such as Monel, tantalum and tantalum alloys, tungsten and tungsten alloys such as Inconel, a combination thereof, or another undisclosed material or combination thereof. Heat dissipation may include a combination of mechanical design and material selection. The responsibility of heat dissipation may fall upon the material selection and design as disclosed above in regard to any component disclosed in this paper. Battery pack 500 may include similar or identical features and materials ascribed to battery pack 500 in order to manage the heat energy produced by these systems and components.

Still referring to FIG. 5, according to embodiments, circuitry disposed within or on battery pack 500 may be shielded from electromagnetic interference. The battery elements and associated circuitry may be shielded by material such as mylar, aluminum, copper a combination thereof, or another suitable material. Battery pack 500 and associated circuitry may include one or more of the aforementioned materials in their inherent construction or additionally added after manufacture for the express purpose of shielding a vulnerable component. Battery pack 500 and associated circuitry may alternatively or additionally be shielded by location. Electrochemical interference shielding by location includes a design configured to separate a potentially vulnerable component from energy that may compromise the function of said component. The location of vulnerable component may be a physical uninterrupted distance away from an interfering energy source, or location configured to include a shielding element between energy source and target component. The shielding may include an aforementioned material in this section, a mechanical design configured to dissipate the interfering energy, and/or a combination thereof. The shielding comprising material, location and additional shielding elements may defend a vulnerable component from one or more types of energy at a single time and instance or include separate shielding for individual potentially interfering energies.

Referring again to FIG. 5, battery module sense board 520 may include a first opposite and opposing flat surface and may be configured to cover a portion of battery module within battery pack and face directly to at least an end of electrochemical battery cells. Battery module sense board 520 may be consistent with the sense board disclosed in U.S. patent application Ser. No. 16/948,140 entitled, "System and Method for High Energy Density Battery Module" and incorporated herein by reference in its entirety.

Figure 9:
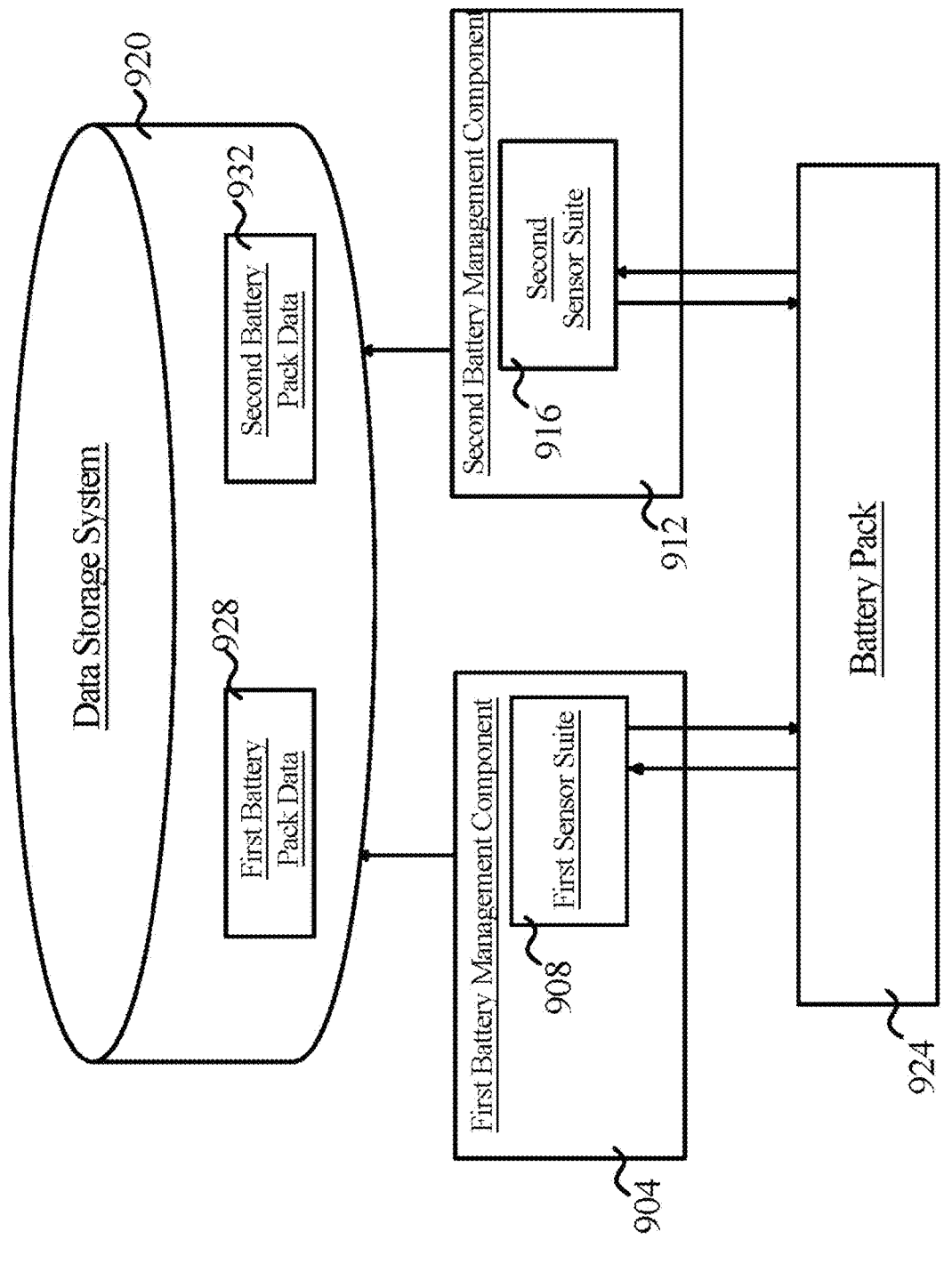
FIG. 9 is an exemplary embodiment of a data storage system.

Referring now to FIG. 9, an embodiment of battery management component system 900 is presented. Battery management system 900 may be integrated in a battery pack configured for use in an electric aircraft. Battery management system 900 may be integrated in a portion of the battery pack or subassembly thereof. Battery management system 900 may include first battery management component 904 disposed on a first end of the battery pack. One of ordinary skill in the art will appreciate that there are various areas in and on a battery pack and/or subassemblies thereof that may include first battery management component 904. First battery management component 904 may take any suitable form. In a non-limiting embodiment, first battery management component 904 may include a circuit board, such as a printed circuit board and/or integrated circuit board, a subassembly mechanically coupled to at least a portion of the battery pack, standalone components communicatively coupled together, or another undisclosed arrangement of components; for instance, and without limitation, a number of components of first battery management component 904 may be soldered or otherwise electrically connected to a circuit board. First battery management component may be disposed directly over, adjacent to, facing, and/or near a battery module and specifically at least a portion of a battery cell. First battery management component 904 includes first sensor suite 908. First sensor suite 908 may be configured to measure, detect, sense, and transmit first plurality of battery pack data 928 to data storage system 920.

Referring again to FIG. 9, battery management system 900 includes second battery management component 912. Second battery management component 912 is disposed in or on a second end of battery pack 924. Second battery management component 912 includes second sensor suite 916. Second sensor suite 916 may be consistent with the description of any sensor suite disclosed herein. Second sensor suite 916 is configured to measure second plurality of battery pack data 932. Second plurality of battery pack data 932 may be consistent with the description of any battery pack data disclosed herein. Second plurality of battery pack data 932 may additionally or alternatively include data not measured or recorded in another section of battery management system 900. Second plurality of battery pack data 932 may be communicated to additional or alternate systems to which it is communicatively coupled. Second sensor suite 916 includes a humidity sensor consistent with any humidity sensor disclosed herein.

With continued reference to FIG. 9, first battery management component 904 disposed in or on battery pack 924 may be physically isolated from second battery management component 912 also disposed on or in battery pack 924. "Physical isolation," for the purposes of this disclosure, refer to a first system's components, communicative coupling, and any other constituent parts, whether software or hardware, are separated from a second system's components, communicative coupling, and any other constituent parts, whether software or hardware, respectively. First battery management component 1904 and second battery management component 912 may perform the same or different functions in battery management system 900. In a non-limiting embodiment, the first and second battery management components perform the same, and therefore redundant functions. If, for example, first battery management component 904 malfunctions, in whole or in part, second battery management component 912 may still be operating properly and therefore battery management system 900 may still operate and function properly for electric aircraft in which it is installed. Additionally or alternatively, second battery management component 912 may power on while first battery management component 904 is malfunctioning. One of ordinary skill in the art would understand that the terms "first" and "second" do not refer to either "battery management components" as primary or secondary. In non-limiting embodiments, first battery management component 904 and second battery management component 912 may be powered on and operate through the same ground operations of an electric aircraft and through the same flight envelope of an electric aircraft. This does not preclude one battery management component, first battery management component 904, from taking over for second battery management component 912 if it were to malfunction. In non-limiting embodiments, the first and second battery management components, due to their physical isolation, may be configured to withstand malfunctions or failures in the other system and survive and operate. Provisions may be made to shield first battery management component 904 from second battery management component 912 other than physical location such as structures and circuit fuses. In non-limiting embodiments, first battery management component 904, second battery management component 912, or subcomponents thereof may be disposed on an internal component or set of components within battery pack 924, such as on a battery module sense board.

Referring again to FIG. 9, first battery management component 904 may be electrically isolated from second battery management component 908. "Electrical isolation," for the purposes of this disclosure, refer to a first system's separation of components carrying electrical signals or electrical energy from a second system's components. First battery management component 904 may suffer an electrical catastrophe, rendering it inoperable, and due to electrical isolation, second battery management component 912 may still continue to operate and function normally, managing the battery pack of an electric aircraft. Shielding such as structural components, material selection, a combination thereof, or another undisclosed method of electrical isolation and insulation may be used, in non-limiting embodiments. For example, a rubber or other electrically insulating material component may be disposed between the electrical components of the first and second battery management components preventing electrical energy to be conducted through it, isolating the first and second battery management components from each other.

With continued reference to FIG. 9, battery management system 900 includes data storage system 920. Data storage system 920 is configured to store first plurality of battery pack data 928 and second plurality of battery pack data 932. Data storage system 920 may include a database. Data storage system 920 may include a solid-state memory or tape hard drive. Data storage system 1920 may be communicatively coupled to first battery management component 904 and second battery management component 912 and may be configured to receive electrical signals related to physical or electrical phenomenon measured and store those electrical signals as first battery pack data 928 and second battery pack data 932, respectively. Alternatively, data storage system 920 may include more than one discrete data storage systems that are physically and electrically isolated from each other. In this non-limiting embodiment, each of first battery management component 904 and second battery management component 912 may store first battery pack data 928 and second battery pack data 932 separately. One of ordinary skill in the art would understand the virtually limitless arrangements of data stores with which battery management system 900 could employ to store the first and second plurality of battery pack data.

Referring again to FIG. 9, data storage system 920 stores first plurality of battery pack data 928 and second plurality of battery pack data 932. First plurality of battery pack data 928 and second plurality of battery pack data 932 may include total flight hours that battery pack 1924 and/or electric aircraft have been operating. The first and second plurality of battery pack data may include total energy flowed through battery pack 924. Data storage system 920 may be communicatively coupled to sensors that detect, measure and store energy in a plurality of measurements which may include current, voltage, resistance, impedance, coulombs, watts, temperature, or a combination thereof. Additionally or alternatively, data storage system 920 may be communicatively coupled to a sensor suite consistent with this disclosure to measure physical and/or electrical characteristics. Data storage system 920 may be configured to store first battery pack data 928 and second battery pack data 932 wherein at least a portion of the data includes battery pack maintenance history. Battery pack maintenance history may include mechanical failures and technician resolutions thereof, electrical failures and technician resolutions thereof. Additionally, battery pack maintenance history may include component failures such that the overall system still functions. Data storage system 1920 may store the first and second battery pack data that includes an upper voltage threshold and lower voltage threshold consistent with this disclosure. First battery pack data 928 and second battery pack data 932 may include a moisture level threshold. The moisture level threshold may include an absolute, relative, and/or specific moisture level threshold.

Figure 7:
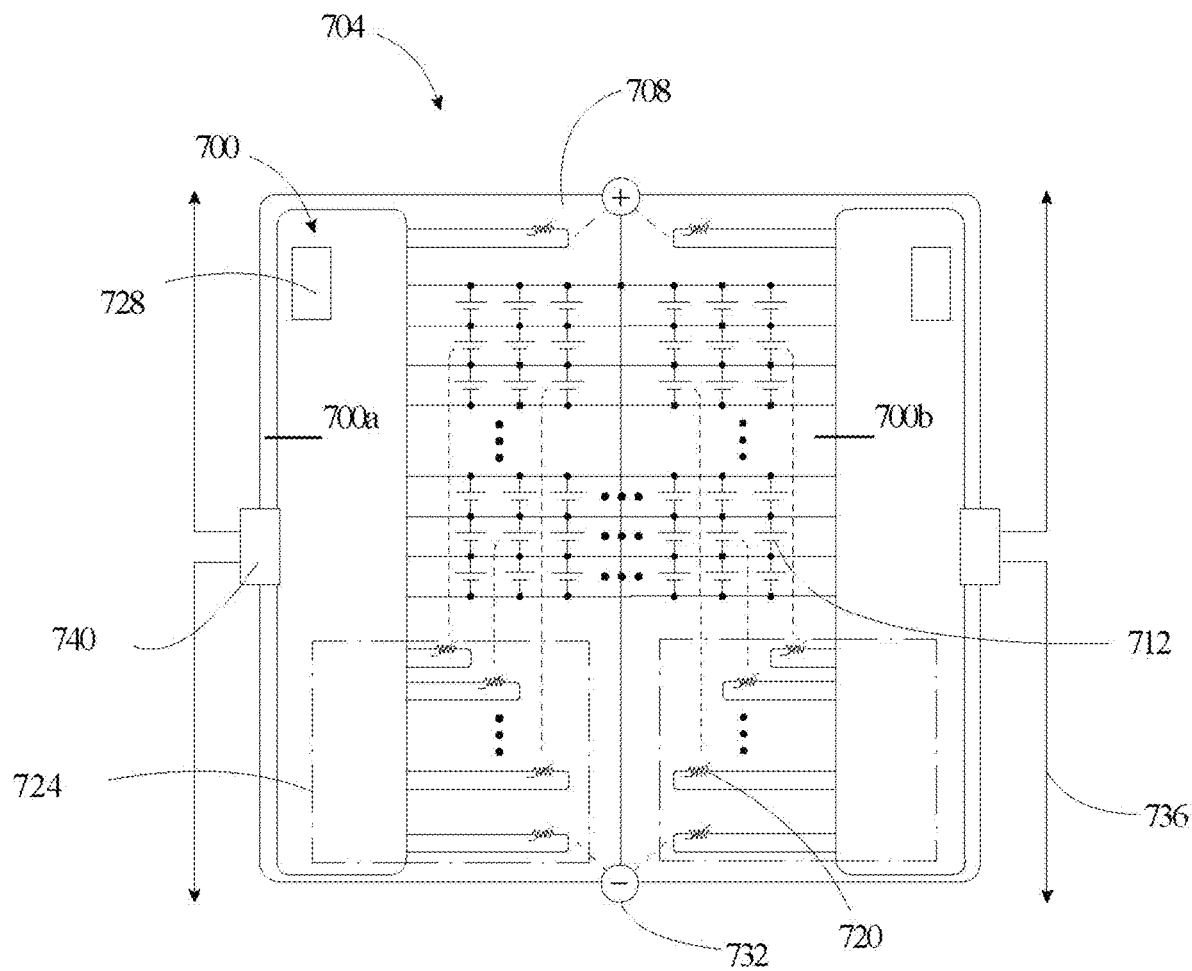
FIG. 7 is a block diagram of an exemplary embodiment of a module monitor unit in one or more aspect of the present disclosure.

Referring now to FIG. 7, an exemplary embodiment of a module monitor unit (MMU) 700 is presented in accordance with one or more embodiments of the present disclosure. In one or more embodiments, MMU 700 may be configured to monitor an operating condition of a battery pack 704. For example, and without limitation, MMU 700 may monitor an operating condition of a battery module 708 and/or a battery cell 712 of battery pack 704. In one or more embodiments, MMU 700 may be attached to battery module 708. For example, and without limitation, MMU 700 may include a housing 716 that is attached to battery module 708, where circuit of MMU 700 may be disposed at least partially therein, as discussed further in this disclosure. In one or more embodiments, a housing may include a polymer, stainless steel, carbon steel, fiberglass, and polycarbonate. In other embodiments, MMU 700 may be remote to battery module 708.

Still referring to FIG. 7, in one or more embodiments, a plurality of MMUs 700 may be configured to monitor battery module 708 and/or battery cell 712. For instance, and without limitation, a first MMU 700*a* may be position at one end of battery module 708, and a second MMU 700*b* may be positioned at an opposing end of battery module 708. This arrangement may allow for redundancy in monitoring of battery cell 712. For example, and without limitation, if first MMU 700*a* fails, then second MMU 700*b* may continue to work properly and monitor the operating condition of each battery cell 712 of battery module 708. In one or more embodiments, MMU 700 may monitor the operating condition of a plurality of battery cells.

Still referring to FIG. 7, in one or more embodiments, MMU 700 is configured to detect a measurement parameter of battery module 708. For the purposes of this disclosure, a "measurement parameter" is detected electrical or physical input, characteristic, and/or phenomenon related to a state of battery pack 704 and/or components thereof. For example, and without limitation, a measurement parameter may be a temperature, a voltage, a current, a moisture level/humidity, a gas level, or the like.

Still referring to FIG. 7, in one or more embodiments, MMU 700 may be configured to perform cell balancing and/or load sharing during the charging of battery pack 704. Cell balancing may be used when a battery module includes a plurality of battery cells 712. Cell unbalance includes variances in charge and discharge of each battery cell depending on an operating condition of each battery cell 712. Cell unbalance may result in damage, such as degradation or premature charge termination, of a battery cell. For example, a battery cell with a higher SOC than other battery cells may be exposed to overvoltage during charging. Cell balancing may include compensating for a variance in SOC, internal impedance, total chemical capacity, or the like. For instance, MMU 700 may perform cell balancing for SOC and thus regulate voltage input of battery cells 712. For instance, and without limitation, charging of battery pack 704 may be shared throughout a plurality of battery cells 712 by directing electrical power through balance resistors and dissipating voltage through resistors as heat. For example, and without limitation, resistor may include a nonlinear resistor, such as a thermistor 720. Thermistor 720 may be configured to provide cell balancing by reducing a voltage supplied to a battery cell of the battery module. The reduction in the voltage supplied to the battery cell may be achieved via heat dissipation. In one or more non-limiting embodiments, MMU 700 may detect the charge of each battery and thermistors 720 of MMU 700 may be configured to reduce a current and/or voltage supplied to a battery cell 712 as a function of a temperature of the thermistor. For example, and without limitation, if a battery cell is being overcharged then the temperature of the connected circuit and thermistor may also experience and increase in temperature; as a result the thermistor may increase in resistance and a fraction of the supplied voltage across the thermistor will also change, which results in a decrease in voltage received by the battery cell. In this manner, battery cells 712 may be charged evenly during recharging and/or charging of battery pack 704 by, for example, a charging station or an electric grid. For example, and without limitation, battery cells with a lower SOC will charge more than battery cells with a greater SOC by thermistors 720 dissipating voltage to the battery cells with the greater SOC. In one or more embodiments, cell balancing may be equally distributed, where each battery cell receives an equal amount of electricity depending on how many amps are available from the charger and how many cells need to be charged. For example, and without limitation, a current may be equally distributed to each battery cell by MMU 700. In another embodiment, MMU 700 may detect an SOC of each battery cell and distribute current to each battery cell in various amounts as a function of the detected SOC of each battery cell. For example, and without limitation, MMU may detect that a first battery cell has an SOC of 20% and a second battery cell has as SOC of 80%. During recharging, the current and/or voltage to the first battery may be increased so that first battery cell is charged faster than the second battery cell. In one or more non-limiting embodiments, once first battery cell is at the same SOC as the second battery cell during recharging, distribution of current and/or voltage to each battery cell may be adjusted again so that the first battery cell and the second battery cell receive an equal charge. In one or more embodiments, MMU 700 is configured to monitor a temperature of battery module 708. For example, MMU 700 may include a sensor 724 configured to detect a temperature parameter of battery cell 712. For example, and without limitation, sensor 724 may include thermistor 720, which may be used to measure a temperature parameter of battery cell 712. As used in this disclosure, a thermistor includes a resistor having a resistance dependent on temperature. In one or more embodiments, sensor 724 may include circuitry configured to generate a measurement datum correlated to the detected measurement parameter, such as a temperature of battery cell 712 detected by thermistor 720. A thermistor may include metallic oxides, epoxy, glass, and the like. A thermistor may include a negative temperature coefficient (NTC) or a positive temperature coefficient (PTC). Thermistors may be beneficial do to being durable, compact, inexpensive, and relatively accurate. In one or more embodiments, a plurality of thermistors 720 may be used to provide redundant measuring of a state of battery cell 712, such as temperature. In other embodiments, MMU 700 may also include a resistance temperature detector (RTD), integrated circuit, thermocouple, thermometer, microbolometer, a thermopile infrared sensor, and/or other temperature and/or thermal sensors, as discussed further below in this disclosure. In one or more embodiments, thermistor 720 may detect a temperature of battery cell 712. Subsequently, MMU 700 may generate a sensor signal output containing information related to the detected temperature of battery cell 712. In one or more embodiments, sensor signal output may include measurement datum containing information representing a detected measurement parameter.

Still referring to FIG. 7, In one or more embodiments, sensor 724 may include a sensor suite 300 (shown in FIG. 3) or one or more individual sensors, which may include, but are not limited to, one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, airspeed sensors, throttle position sensors, and the like. Sensor 724 may be a contact or a non-contact sensor. For example, and without limitation, sensor 724 may be connected to battery module 708 and/or battery cell 712. In other embodiments, sensor 724 may be remote to battery module and/or battery cell 712. Sensor 724 may be communicatively connected to a controller of a PMU so that sensor 724 may transmit/receive signals to/from the controller respectively, as discussed below in this disclosure. Signals, such as signals of sensor 724 and a controller may include electrical, electromagnetic, visual, audio, radio waves, or another undisclosed signal type alone or in combination. In one or more embodiments, communicatively connecting is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit.

Still referring to FIG. 7, in one or more embodiments, MMU 700 may include a control circuit that processes the received measurement datum from sensor 724. In one or more embodiments, control circuit may be configured to perform and/or direct any actions performed by MMU 700 and/or any other component and/or element described in this disclosure. Control circuit may include any analog or digital control circuit, including without limitation a combinational and/or synchronous logic circuit, a processor, microprocessor, microcontroller, any combination thereof, or the like. In one or more embodiments, control circuit may be solely constructed from hardware; thus, control circuit may perform without using software. Not relying on software may increase durability and speed of control circuit while reducing costs. For example, and without limitations, control circuit may include logic gates and/or thermistors, as discussed further in this disclosure. In some embodiments, control circuit 728 may be integrated into MMU 700, as shown in FIG. 7. In other embodiments, control circuit 728 may be remote to MMU 700. In one or more nonlimiting exemplary embodiments, if measurement datum of a temperature of a battery module 708, such as at a terminal 732, is higher than a predetermined threshold, control circuit 728 may determine that the temperature of battery cell 712 indicates a critical event and thus is malfunctioning. For example, a high voltage (HV) electrical connection of battery module terminal 732 may be short circuiting. If control circuit 728 determines that a HV electrical connection is malfunctioning, control circuit 728 may terminate a physical and/or electrical communication of the HV electrical connection to prevent a dangerous or detrimental reaction, such as a short, that may result in an electrical shock, damage to battery pack 704, or even a fire. Thus, control circuit 728 may trip a circuit of battery pack 704 and terminate power flow through the faulty battery module 708 until the detected fault is corrected and/or the excessively high temperature is no longer detected. Temperature sensors, such as thermistor 720 may assist in the monitoring of a cell group's overall temperature, an individual battery cell's temperature, and/or battery module's temperature, as just described above.

Still referring to FIG. 7, in one or more embodiments, MMU 700 may not use software. For example, MMU 700 may not use software to improve reliability and durability of MMU 700. Rather, MMU 700 may be communicatively connected to a remote computing device, such as computing device 204 of FIG. 2. In one or more embodiments, MMU 700 may include one or more circuits and/or circuit elements, including without limitation a printed circuit board component, aligned with a first side of battery module 708 and the openings correlating to battery cells 712. In one or more embodiments, MMU 700 may be communicatively connected to a remote processing module, such as a controller. A controller may be configured to perform appropriate processing of detected temperature characteristics by sensor 724. In one or more embodiments, a controller may include an application-specific integrated circuit (ASIC), field-programmable gate array (FPGA), a central processing unit (CPU), readout integrated circuit (ROIC), or the like, and may be configured to perform characteristic processing to determine a temperature and/or critical event of battery module 708. In these and other embodiments, a controller may operate in conjunction with other components, such as, a memory component, where a memory component includes a volatile memory and/or a non-volatile memory.

Still referring to FIG. 7, in one or more embodiments, each MMU 700 may communicate with another MMU 700 and/or a controller via a communicative connection 736. Each MMU may use a wireless and/or wired connection to communicated with each other. For example, and without limitation, MMU 700a may communicate with an adjacent MMU 700a using an isoSPI connection. As understood by one skilled in the art, and isoSPI connection may include a transformer to magnetically connect and electrically isolate a signal between communicating devices.

Still referring to FIG. 7, in some embodiments, MMU 700 may be as described in U.S. patent application Ser. No. 17/529,447, filed Nov. 18, 2021, titled "MODULE MONITOR UNIT FOR AN ELECTRIC AIRCRAFT BATTERY PACK AND METHODS OF USE" which is incorporated by reference herein in its entirety.

Figure 8:
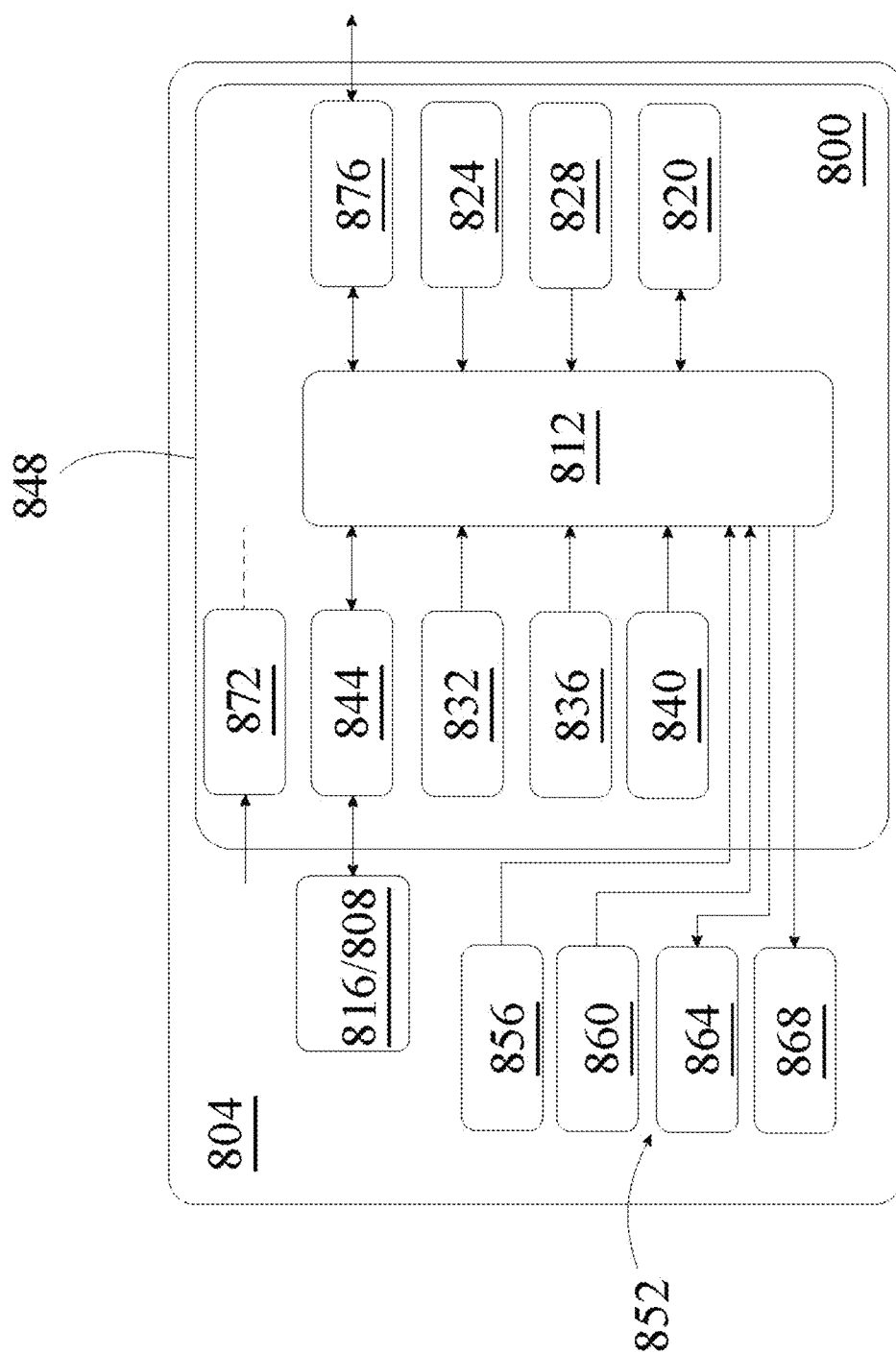
FIG. 8 is a block diagram of another exemplary embodiment a pack monitor unit in one or more aspects of the present disclosure.

Referring now to FIG. 8, an exemplary embodiment of a pack monitoring unit (PMU) 800 is shown in accordance with one or more embodiments of the present disclosure. In one or more embodiments, PMU 800 may be implemented in a battery management system (shown in FIG. 6) to monitor a battery pack 804 and/or components of battery pack 804. In one or more embodiments, PMU 800 may receive a condition parameter from a sensor that is configured to detect a condition parameter of battery pack 804. In one or more embodiments, PMU 800 may include a sensor. In other embodiments, sensor may be remote to PMU 800, for example and without limitation, a sensor of a module monitor unit (MMU) 816. As used in this disclosure, a "condition parameter" is a detected electrical or physical input, characteristic, and/or phenomenon related to a state of a battery pack. For example, and without limitation, sensor 808 may measure a condition parameter, such as temperature, of a battery module terminal and/or a battery cell of battery pack 804. A condition parameter may include a temperature, a voltage, a current, a pressure, a gas level, a moisture/humidity level, an orientation, or the like, of battery pack 804 and/or a component of battery pack 804, such as a battery module or a battery cell (shown in FIG. 4).

Still referring to FIG. 8, in one or more embodiments, condition parameter of a battery module may be detected by sensor 808, which may be communicatively connected to an MMU 816 that is incorporated in a battery module, as discussed further below in this disclosure. Sensor 808 may include a sensor suite 300 (shown in FIG. 3) or one or more individual sensors, which may include, but are not limited to, one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, bolometers, and the like. Sensor 808 may be a contact or a non-contact sensor. For example, and without limitation, sensor 808 may be connected to battery module and/or battery cell of battery pack 804. In other embodiments, sensor 808 may be remote to battery module and/or battery cell.

Still referring to FIG. 8, sensor 808 may generate a measurement datum, which is a function of a detected condition parameter. For the purposes of this disclosure, "measurement datum" is an electronic signal representing an information and/or a parameter of a detected electrical and/or physical characteristic and/or phenomenon correlated with a state of a battery pack. For example, and without limitation, a sensor signal output includes a measurement datum. In one or more embodiments, measurement datum may include data of a condition parameter regarding a detected state of a battery cell. In one or more embodiments, measurement datum may include a quantitative and/or numerical value representing a temperature, pressure, moisture level, gas level, orientation, or the like. For example, and without limitation, a measurement datum may include a temperature of 75° F. In one or more embodiments, sensor 808 is configured to transmit measurement datum to PMU 800. PMU 800 is configured to receive measurement datum and process the received measurement datum. Though sensor 808 is described as providing one or more sensors, PMU 800 may also include a sensor that detects a parameter condition of battery pack 804 and generates a measurement datum to transmit to controller 812. For example, PMU 800 may include a pressure sensor 824, a real time clock (RTC) sensor 828 that is used to track the current time and date, a humidity sensor 832, an accelerometer/IMU 836, or other sensor 840.

Still referring to FIG. 8, PMU 800 includes a controller 812. Sensor 808 may be communicatively connected to controller 812 of PMU 800 so that sensor 808 may transmit/receive signals to/from controller 812. Signals, such as signals of sensor 808 and/or controller 812, may include electrical, electromagnetic, visual, audio, radio waves, or another undisclosed signal type alone or in combination. In one or more embodiments, communicatively connecting is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. In one or more embodiments, controller 812 is configured to receive measurement datum from sensor 808. For example, PMU 800a may receive a plurality of measurement data from MMU 816a (shown in FIG. 2). Similarly, PMU 800b may receive a plurality of measurement data from MMU 816b (shown in FIG. 2). In one or more embodiments, PMU 800 receives measurement datum from MMU 816 via a communication component 844. In one or more embodiments, communication component 844 may be a transceiver. For example, and without limitation, communication component 844 may include an isoSPI communications interface.

Still referring to FIG. 8, in one or more embodiments, controller 812 of PMU 800 may be configured to identify an operating condition of battery module 872 as a function of measurement datum. For the purposes of this disclosure, an "operating condition" is a state and/or working order of a battery pack and/or any components thereof. For example, and without limitation, an operating condition may include a state of charge (SOC), a depth of discharge (DOD), a temperature reading, a moisture/humidity level, a gas level, a chemical level, or the like. In one or more embodiments, controller 812 of PMU 800 is configured to determine a critical event element if operating condition is outside of a predetermined threshold (also referred to herein as a "threshold"). For the purposes of this disclosure, a "critical event element" is a failure and/or critical operating condition of a battery pack and/or components thereof that may be harmful to the battery pack and/or corresponding electric aircraft. In one or more embodiments, a critical event element may include an overcurrent, undercurrent, overvoltage, overheating, high moisture levels, byproduct presence, low SOC, high DOD, or the like. For instance, and without limitation, if an identified operating condition, such as a temperature reading of 50° F., of a battery cell of battery pack 804, is outside of a predetermined threshold, such as 75° F. to 90° F., where 75° F. is the temperature threshold and 90° F. is the upper temperature threshold, then a critical event element is determined by controller 812 of PMU 800 since 50° F. is beyond the lower temperature threshold. In another example, and without limitation, PMU 800 may use measurement datum from MMU 816 to identify a temperature of 95° F. for a battery module terminal. If the predetermined threshold is, for example, 90° F., then the determined operating condition exceeds the predetermined threshold, and a critical event element is determined by controller 812, such as a risk of a short at the terminal of a battery module. As used in this disclosure, a "predetermined threshold" is a limit and/or range of an acceptable quantitative value and/or combination of values such as an n-tuple or function such as linear function of values, and/or representation related to a normal operating condition of a battery pack and/or components thereof. In one or more embodiments, an operating condition outside of the threshold is a critical operating condition that indicates that a battery pack is malfunctioning, which triggers a critical event element. An operating condition within the threshold is a normal operating condition that indicates that battery pack is working properly and that no action is required by PMU 800 and/or a user. For example, and without limitation, if an operating condition of temperature exceeds a predetermined threshold, as described above in this disclosure, then a battery pack is considered to be operating at a critical operating condition and may be at risk of overheating and experiencing a catastrophic failure.

Still referring to FIG. 8, in one or more embodiments, controller 812 of PMU 800 is configured to generate an action command if critical event element is determined by controller 812. For the purposes of this disclosure, an "action command" is a control signal generated by a controller that provides instructions related to reparative action needed to prevent and/or reduce damage to a battery back, components thereof, and/or aircraft as a result of a critical operating condition of the battery pack. Continuing the previously described example above, if an identified operating condition includes a temperature of 95° F., which exceeds predetermined threshold, then controller 812 may determine a critical event element indicating that battery pack 804 is working at a critical temperature level and at risk of catastrophic failure, such as short circuiting or catching fire. In one or more embodiments, critical event elements may include high shock/drop, overtemperature, undervoltage, high moisture, contactor welding, SOC unbalance, and the like. In one or more embodiments, an action command may include an instruction to terminate power supply from battery pack 804 to electric aircraft, power off battery pack 804, terminate a connection between one or more battery cells, initiate a temperature regulating system, such as a coolant system or opening of vents to circulate air around or through battery pack 804, or the like. In one or more embodiments, controller 812 may conduct reparative procedures via action command after determining critical even element to reduce or eliminate critical element event. For example, and without limitation, controller 812 may initiate reparative procedure of a circulation of a coolant through a cooling system of battery pack 804 to lower the temperature if a battery module if the determined temperature of the battery module exceeds a predetermined threshold. In another example, and without limitation, if a gas and/or chemical accumulation level is detected that is then determined to exceed a predetermined threshold, then high voltage disconnect may terminate power supply connection. According to some embodiments, a vent of battery pack 804 may be opened to circulate air through battery pack 804 and reduce detected gas levels. Additionally, vent of battery pack 804 may have a vacuum applied to aid in venting of ejecta. Vacuum pressure differential may range from 0.1"Hg to 36"Hg.

Still referring to FIG. 8, in one or more embodiments, a critical event alert may be generated by controller 812 of PMU 800 in addition to an action command. The critical event alert may include a lockout feature, which is an alert that remains even after rebooting of the battery pack and/or corresponding systems. Lockout feature may only be removed by a manual override or once the critical event element has ceased and is no longer determined by controller 812. In one or more embodiments, controller 812 may continuously monitor battery pack 804 and components thereof so that an operating condition is known at all times.

Still referring to FIG. 8, in one or more embodiments, controller 812 may include a computing device, which may be implemented in any manner suitable for implementation of a computing device as described in this disclosure, a microcontroller, a logic device, a central processing unit (CPU), a microprocessor, a digital signal processor (DSP), an application specific integrated circuit (ASIC), a control circuit, a combination thereof, or the like. In one or more embodiments, output signals from various components of battery pack 804 may be analog or digital. Controller 812 may convert output signals from MMU 816, sensor 808, and/or sensors 824,828,832,836,840 to a usable form by the destination of those signals. The usable form of output signals from MMUs and/or sensors, through processor may be either digital, analog, a combination thereof, or an otherwise unstated form. Processing may be configured to trim, offset, or otherwise compensate the outputs of sensor. Based on MMU and/or sensor output, controller can determine the output to send to a downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components. In one or more embodiments, PMU 800 may run state estimation algorithms. In one or more embodiments, PMU 800 may communicate with MMU 816 and/or sensor 808 via a communication component 844. For example, and without limitation, PMU may communicate with MMU 816 using an isoSPI transceiver.

Still referring to FIG. 8, in one or more embodiments, controller 812 may be designed and/or configured to perform any method, method step, or sequence of method steps in any embodiment described in this disclosure, in any order and with any degree of repetition. For instance, controller 812 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. controller 812 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Referring again to FIG. 8, PMU 800 may include a memory component 820 configured to store data related to battery pack 804 and/or components thereof. In one or more embodiments, memory component 820 may store battery pack data. Battery pack data may include generated data, detected data, measured data, inputted data, determined data and the like. For example, measurement datum from MMU 816 and or a sensor may be stored in memory component 820. In another example, critical event element and/or corresponding lockout flag may be stored in memory component 820. Battery pack data may also include inputted datum, which may include total flight hours that battery pack 804 and/or electric aircraft, such as electric aircraft 100

(shown in FIG. 1), have been operating, flight plan of electric aircraft, battery pack identification, battery pack verification, a battery pack maintenance history, battery pack specifications, or the like. In one or more embodiments, battery pack maintenance history may include mechanical failures and technician resolutions thereof, electrical failures and technician resolutions thereof. In one or more embodiments, memory component 820 may be communicatively connected to sensors, such as sensor 808, that detect, measure, and obtain a plurality of measurements, which may include current, voltage, resistance, impedance, coulombs, watts, temperature, moisture/humidity, or a combination thereof. Additionally or alternatively, memory component 820 may be communicatively connected to a sensor suite consistent with this disclosure to measure physical and/or electrical characteristics. In one or more embodiments, memory component 820 may store the battery pack data that includes a predetermined threshold consistent with this disclosure. The moisture-level threshold may include an absolute, relative, and/or specific moisture-level threshold. Battery pack 804 may be designed to the Federal Aviation Administration (FAA)'s Design Assurance Level A (DAL-A), using redundant DAL-B subsystems.

Still referring to FIG. 8, in one or more embodiments, memory component 820 may be configured to save measurement datum, operating condition, critical event element, and the like periodically in regular intervals to memory component 820. "Regular intervals," for the purposes of this disclosure, refers to an event taking place repeatedly after a certain amount of elapsed time. In one or more embodiments, PMU 800 may include a timer that works in conjunction to determine regular intervals. In other embodiments, PMU may continuously update operating condition or critical event element and, thus, continuously store data related the information in memory component. A Timer may include a timing circuit, internal clock, or other circuit, component, or part configured to keep track of elapsed time and/or time of day. For example, in non-limiting embodiments, a data storage system (e.g., data storage system 620 or 920) may save the first and second battery pack data every 30 seconds, every minute, every 30 minutes, or another time period according to timer. Additionally or alternatively, memory component 820 may save battery pack data after certain events occur, for example, in non-limiting embodiments, each power cycle, landing of the electric aircraft, when battery pack is charging or discharging, a failure of battery module, a malfunction of battery module, a critical event element, or scheduled maintenance periods. In non-limiting embodiments, battery pack 804 phenomena may be continuously measured and stored at an intermediary storage location, and then permanently saved by memory component 820 at a later time, like at a regular interval or after an event has taken place as disclosed hereinabove. Additionally or alternatively, a data storage system may be configured to save battery pack data at a predetermined time. "Predetermined time," for the purposes of this disclosure, refers to an internal clock within battery pack commanding memory component 820 to save battery pack data at that time.

Still referring to FIG. 8, memory component 820 may include a solid-state memory or tape hard drive. Memory component 820 may be communicatively connected to PMU 800 and may be configured to receive electrical signals related to physical or electrical phenomenon measured and store those electrical signals as battery module data. Alternatively, memory component 820 may be a plurality of discrete memory components that are physically and electrically isolated from each other. One of ordinary skill in the art would understand the virtually limitless arrangements of data stores with which battery pack 804 could employ to store battery pack data.

Still referring to FIG. 8, in one or more embodiments, PMU 800 may be configured to communicate with an electric aircraft, such as a flight controller of electric aircraft, using a controller area network (CAN), such as by using a CAN transceiver 876. In one or more embodiments, controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 804 to any destination on or offboard an electric aircraft. PMU 800 may include wiring or conductive surfaces only in portions required to electrically couple bus to electrical power or necessary circuits to convey that power or signals to their destinations. In one or more embodiments, PMU 800 may transmit action command via CAN transceiver 876 and/or an alert to an electric aircraft. For example, and without limitation, PMU 800 may transmit an alert to a user interface, such as a display, of an electric aircraft to indicate to a user that a critical event element has been determined. In one or more embodiments, PMU 800 may also use CAN transceiver 876 to transmit an alert to a remote user device, such as a laptop, mobile device, tablet, or the like.

Still referring to FIG. 8, in one or more embodiments, PMU 800 may include a housing 848. In one or more embodiments, housing 848 may include materials which possess characteristics suitable for thermal insulation, such as fiberglass, iron fibers, polystyrene foam, and thin plastic films, to name a few. Housing 848 may also include polyvinyl chloride (PVC), glass, asbestos, rigid laminate, varnish, resin, paper, Teflon, rubber, and mechanical lamina to physically isolate components of battery pack 804 from external components. In one or more embodiments, housing 848 may also include layers that separate individual components of PMU 800, such as components described above in this disclosure. As understood by one skilled in the art, housing 848 may be any shape or size suitable to attached to a battery module, such as battery module 204 of FIG. 2, of battery pack 804. In one or more embodiments, controller 812, memory component 820, sensor 808, or the like may be at least partially disposed within housing 848.

Still referring to FIG. 8, in one or more embodiments, PMU 800 may be in communication with a high voltage disconnect of battery pack 804. In one or more embodiments, high voltage disconnect may include a bus. A "bus," for the purposes of this disclosure and in electrical parlance is any common connection to which any number of loads, which may be connected in parallel, and share a relatively similar voltage may be electrically coupled. Bus may be responsible for conveying electrical energy stored in battery pack 804 to at least a portion of an electric aircraft, as discussed previously in this disclosure. High voltage disconnect 852 may include a ground fault detection 856, an HV (high voltage) current sense 860, an HV pyro fuse 864, an HV contactor 868, and the like. High voltage disconnect 852 may physically and/or electrically breaks power supply communication between electric aircraft and battery module of battery pack 804. In one or more embodiments, in one or more embodiments, the termination of a power supply connection between high voltage disconnect 852 and electric aircraft may be restored by high voltage disconnect 852 once PMU 800 no longer determined a critical event element. In other embodiments, a power supply connection may need to be restored manually, such as by a user. In one or more embodiments, PMU 800 may also include a switching regulator, which is configured to receive power from a battery module of battery pack 804. Thus, PMU 800 may be powered by energy by battery pack 804.

Still referring to FIG. 8, in some embodiments, PMU 800 may be as described in U.S. patent application Ser. No. 17/529,583, filed Nov. 18, 2021, titled "PACK MONITORING UNIT FOR AN ELECTRIC AIRCRAFT BATTERY PACK AND METHODS OF USE FOR BATTERY MANAGEMENT" which is incorporated by reference herein in its entirety.

Figure 6:
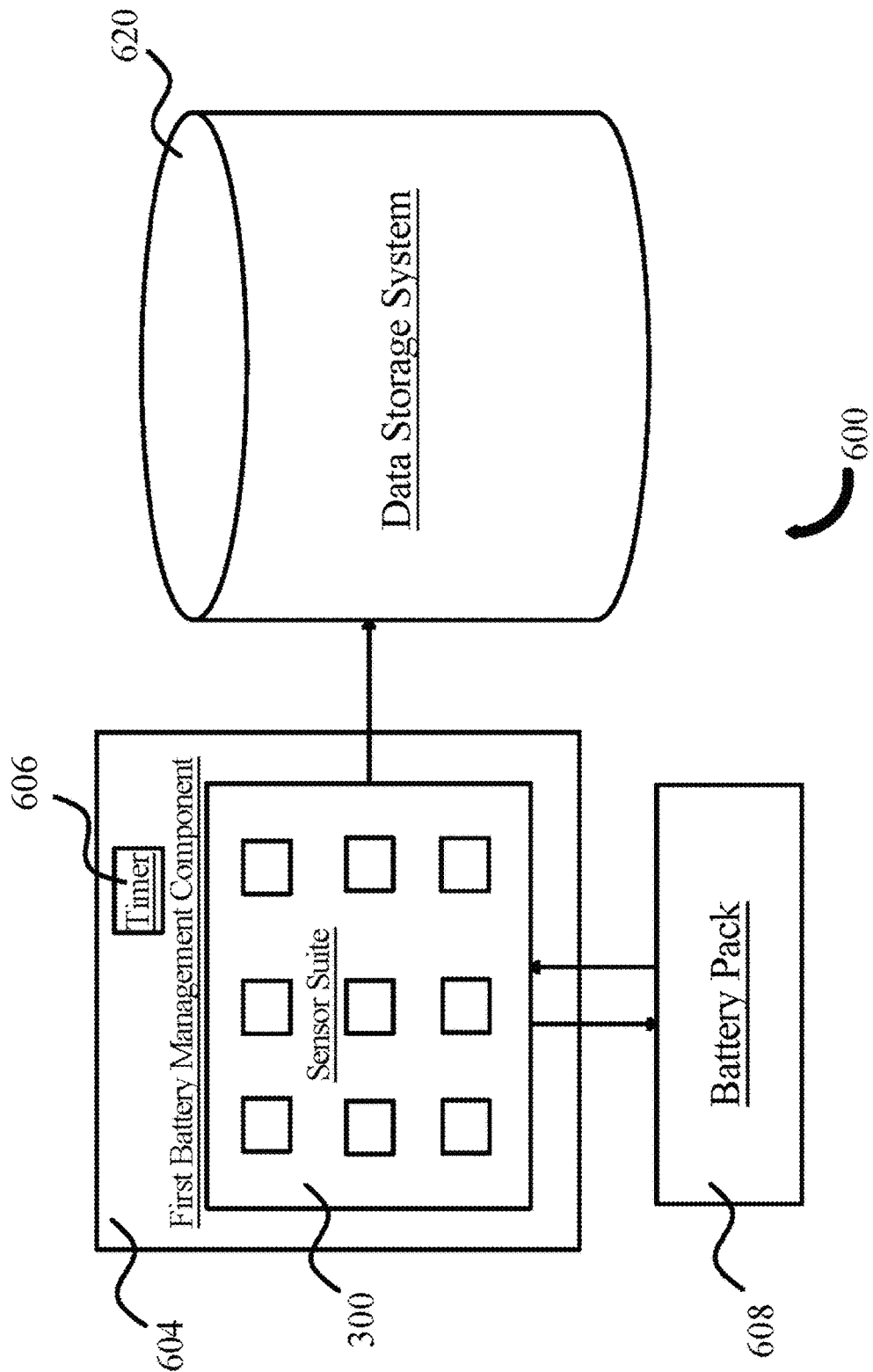
FIG. 6 is an exemplary embodiment of a battery management system.

Referring now to FIG. 6, a block diagram of data collection system 600 is presented. Data collection system 600 includes sensor suite 300, which may be used for first sensor suite 908 in first battery management component 904 or second sensor suite 916 in second battery management component 912 (described above with reference to FIG. 9) or consistent with any sensor suite disclosed hereinabove. Data collection system 600 includes data storage system 620. Sensor suite 300 is configured to measure physical and/or electrical phenomena and characteristics of battery pack 608, in whole or in part. Sensor suite 300 then transmits electrical signals to data storage system 620 to be saved. Those electrical signals are representative of first battery pack data 928 and second battery pack data 932 (described above with reference to FIG. 9). The electrical signals communicated from sensor suite 300, and more moreover from the first or second battery management component to which it belongs may be transformed or conditioned consistent with any signal conditioning present in this disclosure. Data collection system 600 and more specifically first battery management component 604, may be configured to save first battery pack data 928 and second battery pack data 932 periodically in regular intervals to data storage system 920 (described above with reference to FIG. 9). "Regular intervals," for the purposes of this disclosure, refers to an event taking place repeatedly after a certain amount of elapsed time. Data collection system 600 may include first battery management component 606, which may include timer 606. Timer 606 may include a timing circuit, internal clock, or other circuit, component, or part configured to keep track of elapsed time and/or time of day. For example, in non-limiting embodiments, data storage system 620 may save the first and second battery pack data every 30 seconds, every minute, every 30 minutes, or another time period according to timer 904. Additionally or alternatively, data storage system 620 may save the first and second battery pack data after certain events occur, for example, in non-limiting embodiments, each power cycle, landing of the electric aircraft, when battery pack is charging or discharging, or scheduled maintenance periods. In non-limiting embodiments, battery pack 608 phenomena may be continuously measured and stored at an intermediary storage location, and then permanently saved by data storage system 620 at a later time, like at a regular interval or after an event has taken place as disclosed hereinabove. Additionally or alternatively, data storage system may be configured to save first battery pack data 928 and second battery pack data 932 (described above with reference to FIG. 9) at a predetermined time. "Predetermined time," for the purposes of this disclosure, refers to an internal clock within battery management system 600 commanding data storage system 620 to save the first and second battery pack data at that time. For example, data storage system 620 may be configured to save the first and second battery pack data at 0600 hours, 11 P.M. EDT, or another time or multiple times a day.

Figure 10:
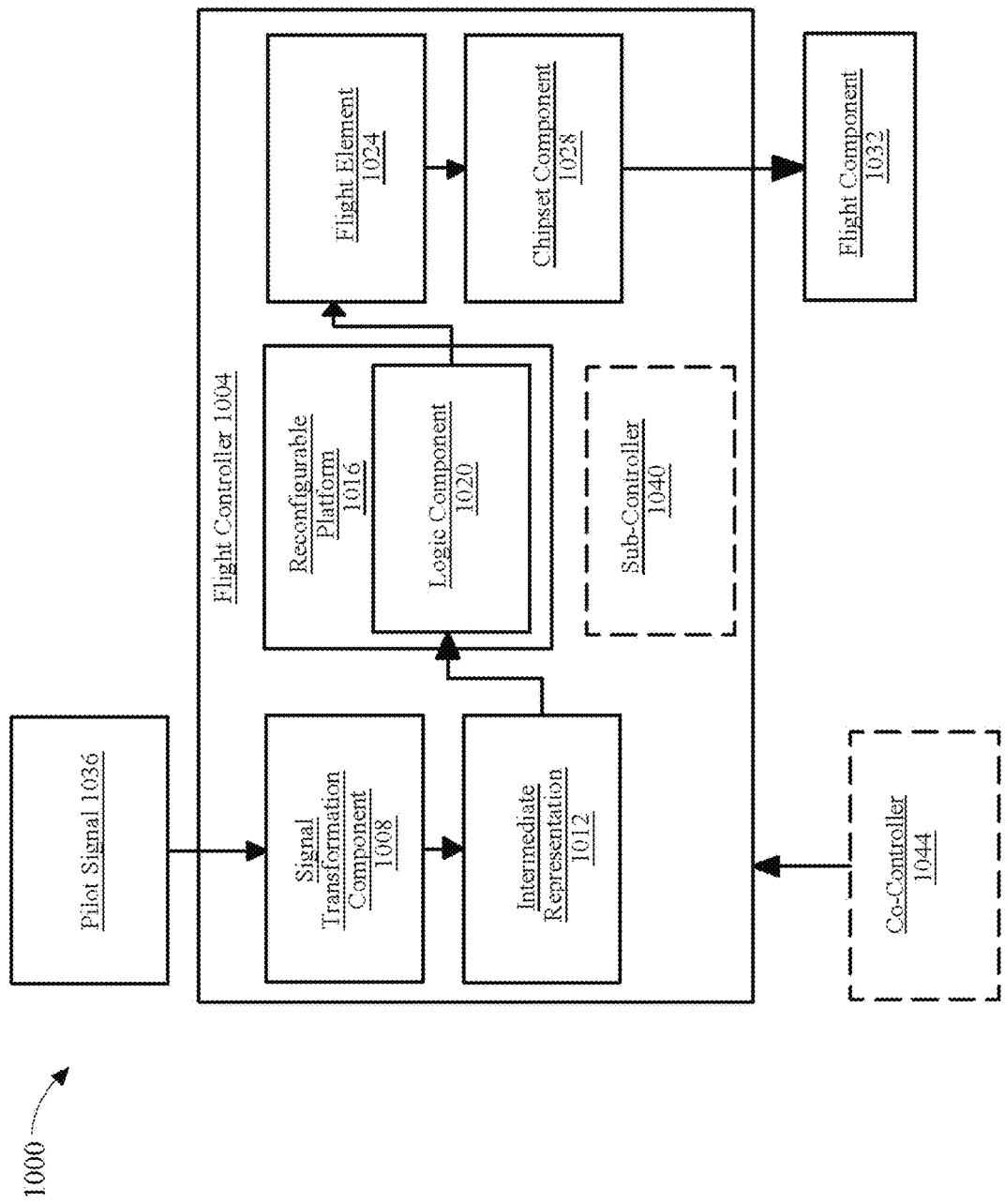
FIG. 10 is an exemplary embodiment of a block diagram of a flight controller.

Referring now to FIG. 10, an exemplary embodiment 1000 of a flight controller 1004 is illustrated. As used in this disclosure a "flight controller" is a computing device of a plurality of computing devices dedicated to data storage, security, distribution of traffic for load balancing, and flight instruction. Flight controller 1004 may include and/or communicate with any computing device as described in this disclosure, including without limitation a microcontroller, microprocessor, digital signal processor (DSP) and/or system on a chip (SoC) as described in this disclosure. Further, flight controller 1004 may include a single computing device operating independently, or may include two or more computing device operating in concert, in parallel, sequentially or the like; two or more computing devices may be included together in a single computing device or in two or more computing devices. In embodiments, flight controller 1004 may be installed in an aircraft, may control the aircraft remotely, and/or may include an element installed in the aircraft and a remote element in communication therewith.

In an embodiment, and still referring to FIG. 10, flight controller 1004 may include a signal transformation component 1008. As used in this disclosure a "signal transformation component" is a component that transforms and/or converts a first signal to a second signal, wherein a signal may include one or more digital and/or analog signals. For example, and without limitation, signal transformation component 1008 may be configured to perform one or more operations such as preprocessing, lexical analysis, parsing, semantic analysis, and the like thereof. In an embodiment, and without limitation, signal transformation component 1008 may include one or more analog-to-digital convertors that transform a first signal of an analog signal to a second signal of a digital signal. For example, and without limitation, an analog-to-digital converter may convert an analog input signal to a 10-bit binary digital representation of that signal. In another embodiment, signal transformation component 1008 may include transforming one or more low-level languages such as, but not limited to, machine languages and/or assembly languages. For example, and without limitation, signal transformation component 1008 may include transforming a binary language signal to an assembly language signal. In an embodiment, and without limitation, signal transformation component 1008 may include transforming one or more high-level languages and/or formal languages such as but not limited to alphabets, strings, and/or languages. For example, and without limitation, high-level languages may include one or more system languages, scripting languages, domain-specific languages, visual languages, esoteric languages, and the like thereof. As a further non-limiting example, high-level languages may include one or more algebraic formula languages, business data languages, string and list languages, object-oriented languages, and the like thereof.

Still referring to FIG. 10, signal transformation component 1008 may be configured to optimize an intermediate representation 1012. As used in this disclosure an "intermediate representation" is a data structure and/or code that represents the input signal. Signal transformation component 1008 may optimize intermediate representation as a function of a data-flow analysis, dependence analysis, alias analysis, pointer analysis, escape analysis, and the like thereof. In an embodiment, and without limitation, signal transformation component 1008 may optimize intermediate representation 1012 as a function of one or more inline expansions, dead code eliminations, constant propagation, loop transformations, and/or automatic parallelization functions. In another embodiment, signal transformation component 1008 may optimize intermediate representation as a function of a machine dependent optimization such as a peephole optimization, wherein a peephole optimization may rewrite short sequences of code into more efficient sequences of code. Signal transformation component 1008 may optimize intermediate representation to generate an output language, wherein an "output language," as used herein, is the native machine language of flight controller 1004. For example, and without limitation, native machine language may include one or more binary and/or numerical languages.

In an embodiment, and without limitation, signal transformation component 1008 may include transform one or more inputs and outputs as a function of an error correction code. An error correction code, also known as error correcting code (ECC), is an encoding of a message or lot of data using redundant information, permitting recovery of corrupted data. An ECC may include a block code, in which information is encoded on fixed-size packets and/or blocks of data elements such as symbols of predetermined size, bits, or the like. Reed-Solomon coding, in which message symbols within a symbol set having q symbols are encoded as coefficients of a polynomial of degree less than or equal to a natural number k, over a finite field F with q elements; strings so encoded have a minimum hamming distance of k+1, and permit correction of (q−k−1)/2 erroneous symbols. Block code may alternatively or additionally be implemented using Golay coding, also known as binary Golay coding, Bose-Chaudhuri, Hocquenghuem (BCH) coding, multidimensional parity-check coding, and/or Hamming codes. An ECC may alternatively or additionally be based on a convolutional code.

In an embodiment, and still referring to FIG. 10, flight controller 1004 may include a reconfigurable hardware platform 1016. A "reconfigurable hardware platform," as used herein, is a component and/or unit of hardware that may be reprogrammed, such that, for instance, a data path between elements such as logic gates or other digital circuit elements may be modified to change an algorithm, state, logical sequence, or the like of the component and/or unit. This may be accomplished with such flexible high-speed computing fabrics as field-programmable gate arrays (FPGAs), which may include a grid of interconnected logic gates, connections between which may be severed and/or restored to program in modified logic. Reconfigurable hardware platform 1016 may be reconfigured to enact any algorithm and/or algorithm selection process received from another computing device and/or created using machine-learning processes.

Still referring to FIG. 10, reconfigurable hardware platform 1016 may include a logic component 1020. As used in this disclosure a "logic component" is a component that executes instructions on output language. For example, and without limitation, logic component may perform basic arithmetic, logic, controlling, input/output operations, and the like thereof. Logic component 1020 may include any suitable processor, such as without limitation a component incorporating logical circuitry for performing arithmetic and logical operations, such as an arithmetic and logic unit (ALU), which may be regulated with a state machine and directed by operational inputs from memory and/or sensors; logic component 1020 may be organized according to Von Neumann and/or Harvard architecture as a non-limiting example. Logic component 1020 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC). In an embodiment, logic component 1020 may include one or more integrated circuit microprocessors, which may contain one or more central processing units, central processors, and/or main processors, on a single metal-oxide-semiconductor chip. Logic component 1020 may be configured to execute a sequence of stored instructions to be performed on the output language and/or intermediate representation 1012. Logic component 1020 may be configured to fetch and/or retrieve the instruction from a memory cache, wherein a "memory cache," as used in this disclosure, is a stored instruction set on flight controller 1004. Logic component 1020 may be configured to decode the instruction retrieved from the memory cache to opcodes and/or operands. Logic component 1020 may be configured to execute the instruction on intermediate representation 1012 and/or output language. For example, and without limitation, logic component 1020 may be configured to execute an addition operation on intermediate representation 1012 and/or output language.

Still referring to FIG. 10, in an embodiment, and without limitation, logic component 1020 may be configured to calculate a flight element 1024. As used in this disclosure a "flight element" is an element of datum denoting a relative status of aircraft. For example, and without limitation, flight element 1024 may denote one or more torques, thrusts, airspeed velocities, forces, altitudes, groundspeed velocities, directions during flight, directions facing, forces, orientations, and the like thereof. For example, and without limitation, flight element 1024 may denote that aircraft is cruising at an altitude and/or with a sufficient magnitude of forward thrust. As a further non-limiting example, flight status may denote that is building thrust and/or groundspeed velocity in preparation for a takeoff. As a further non-limiting example, flight element 1024 may denote that aircraft is following a flight path accurately and/or sufficiently.

Still referring to FIG. 10, flight controller 1004 may include a chipset component 1028. As used in this disclosure a "chipset component" is a component that manages data flow. In an embodiment, and without limitation, chipset component 1028 may include a northbridge data flow path, wherein the northbridge dataflow path may manage data flow from logic component 1020 to a high-speed device and/or component, such as a RAM, graphics controller, and the like thereof. In another embodiment, and without limitation, chipset component 1028 may include a southbridge data flow path, wherein the southbridge dataflow path may manage data flow from logic component 1020 to lower-speed peripheral buses, such as a peripheral component interconnect (PCI), industry standard architecture (ICA), and the like thereof. In an embodiment, and without limitation, southbridge data flow path may include managing data flow between peripheral connections such as ethernet, USB, audio devices, and the like thereof. Additionally or alternatively, chipset component 1028 may manage data flow between logic component 1020, memory cache, and a flight component 1032. As used in this disclosure a "flight component" is a portion of an aircraft that can be moved or adjusted to affect one or more flight elements. For example, flight component 1032 may include a component used to affect the aircrafts' roll and pitch which may comprise one or more ailerons. As a further example, flight component 1032 may include a rudder to control yaw of an aircraft. In an embodiment, chipset component 1028 may be configured to communicate with a plurality of flight components as a function of flight element 1024. For example, and without limitation, chipset component 1028 may transmit to an aircraft rotor to reduce torque of a first lift propulsor and increase the forward thrust produced by a pusher component to perform a flight maneuver.

In an embodiment, and still referring to FIG. 10, flight controller 1004 may be configured generate an autonomous function. As used in this disclosure an "autonomous function" is a mode and/or function of flight controller 1004 that controls aircraft automatically. For example, and without limitation, autonomous function may perform one or more aircraft maneuvers, take offs, landings, altitude adjustments, flight leveling adjustments, turns, climbs, and/or descents. As a further non-limiting example, autonomous function may adjust one or more airspeed velocities, thrusts, torques, and/or groundspeed velocities. As a further non-limiting example, autonomous function may perform one or more flight path corrections and/or flight path modifications as a function of flight element 1024. In an embodiment, autonomous function may include one or more modes of autonomy such as, but not limited to, autonomous mode, semi-autonomous mode, and/or non-autonomous mode. As used in this disclosure "autonomous mode" is a mode that automatically adjusts and/or controls aircraft and/or the maneuvers of aircraft in its entirety. For example, autonomous mode may denote that flight controller 1004 will adjust the aircraft. As used in this disclosure a "semi-autonomous mode" is a mode that automatically adjusts and/or controls a portion and/or section of aircraft. For example, and without limitation, semi-autonomous mode may denote that a pilot will control the propulsors, wherein flight controller 1004 will control the ailerons and/or rudders. As used in this disclosure "non-autonomous mode" is a mode that denotes a pilot will control aircraft and/or maneuvers of aircraft in its entirety.

In an embodiment, and still referring to FIG. 10, flight controller 1004 may generate autonomous function as a function of an autonomous machine-learning model. As used in this disclosure an "autonomous machine-learning model" is a machine-learning model to produce an autonomous function output given flight element 1024 and a pilot signal 1036 as inputs; this is in contrast to a non-machine learning software program where the commands to be executed are determined in advance by a user and written in a programming language. As used in this disclosure a "pilot signal" is an element of datum representing one or more functions a pilot is controlling and/or adjusting. For example, pilot signal 1036 may denote that a pilot is controlling and/or maneuvering ailerons, wherein the pilot is not in control of the rudders and/or propulsors. In an embodiment, pilot signal 1036 may include an implicit signal and/or an explicit signal. For example, and without limitation, pilot signal 1036 may include an explicit signal, wherein the pilot explicitly states there is a lack of control and/or desire for autonomous function. As a further non-limiting example, pilot signal 1036 may include an explicit signal directing flight controller 1004 to control and/or maintain a portion of aircraft, a portion of the flight plan, the entire aircraft, and/or the entire flight plan. As a further non-limiting example, pilot signal 1036 may include an implicit signal, wherein flight controller 1004 detects a lack of control such as by a malfunction, torque alteration, flight path deviation, and the like thereof. In an embodiment, and without limitation, pilot signal 1036 may include one or more explicit signals to reduce torque, and/or one or more implicit signals that torque may be reduced due to reduction of airspeed velocity. In an embodiment, and without limitation, pilot signal 1036 may include one or more local and/or global signals. For example, and without limitation, pilot signal 1036 may include a local signal that is transmitted by a pilot and/or crew member. As a further non-limiting example, pilot signal 1036 may include a global signal that is transmitted by air traffic control and/or one or more remote users that are in communication with the pilot of aircraft. In an embodiment, pilot signal 1036 may be received as a function of a tri-state bus and/or multiplexor that denotes an explicit pilot signal should be transmitted prior to any implicit or global pilot signal.

Still referring to FIG. 10, autonomous machine-learning model may include one or more autonomous machine-learning processes such as supervised, unsupervised, or reinforcement machine-learning processes that flight controller 1004 and/or a remote device may or may not use in the generation of autonomous function. As used in this disclosure "remote device" is an external device to flight controller 1004. Additionally or alternatively, autonomous machine-learning model may include one or more autonomous machine-learning processes that a field-programmable gate array (FPGA) may or may not use in the generation of autonomous function. Autonomous machine-learning process may include, without limitation machine learning processes such as simple linear regression, multiple linear regression, polynomial regression, support vector regression, ridge regression, lasso regression, elasticnet regression, decision tree regression, random forest regression, logistic regression, logistic classification, K-nearest neighbors, support vector machines, kernel support vector machines, naïve bayes, decision tree classification, random forest classification, K-means clustering, hierarchical clustering, dimensionality reduction, principal component analysis, linear discriminant analysis, kernel principal component analysis, Q-learning, State Action Reward State Action (SARSA), Deep-Q network, Markov decision processes, Deep Deterministic Policy Gradient (DDPG), or the like thereof.

In an embodiment, and still referring to FIG. 10, autonomous machine learning model may be trained as a function of autonomous training data, wherein autonomous training data may correlate a flight element, pilot signal, and/or simulation data to an autonomous function. For example, and without limitation, a flight element of an airspeed velocity, a pilot signal of limited and/or no control of propulsors, and a simulation data of required airspeed velocity to reach the destination may result in an autonomous function that includes a semi-autonomous mode to increase thrust of the propulsors. Autonomous training data may be received as a function of user-entered valuations of flight elements, pilot signals, simulation data, and/or autonomous functions. Flight controller 1004 may receive autonomous training data by receiving correlations of flight element, pilot signal, and/or simulation data to an autonomous function that were previously received and/or determined during a previous iteration of generation of autonomous function. Autonomous training data may be received by one or more remote devices and/or FPGAs that at least correlate a flight element, pilot signal, and/or simulation data to an autonomous function. Autonomous training data may be received in the form of one or more user-entered correlations of a flight element, pilot signal, and/or simulation data to an autonomous function.

Still referring to FIG. 10, flight controller 1004 may receive autonomous machine-learning model from a remote device and/or FPGA that utilizes one or more autonomous machine learning processes, wherein a remote device and an FPGA is described above in detail. For example, and without limitation, a remote device may include a computing device, external device, processor, FPGA, microprocessor and the like thereof. Remote device and/or FPGA may perform the autonomous machine-learning process using autonomous training data to generate autonomous function and transmit the output to flight controller 1004. Remote device and/or FPGA may transmit a signal, bit, datum, or parameter to flight controller 1004 that at least relates to autonomous function. Additionally or alternatively, the remote device and/or FPGA may provide an updated machine-learning model. For example, and without limitation, an updated machine-learning model may be comprised of a firmware update, a software update, an autonomous machine-learning process correction, and the like thereof. As a non-limiting example a software update may incorporate a new simulation data that relates to a modified flight element. Additionally or alternatively, the updated machine learning model may be transmitted to the remote device and/or FPGA, wherein the remote device and/or FPGA may replace the autonomous machine-learning model with the updated machine-learning model and generate the autonomous function as a function of the flight element, pilot signal, and/or simulation data using the updated machine-learning model. The updated machine-learning model may be transmitted by the remote device and/or FPGA and received by flight controller 1004 as a software update, firmware update, or corrected autonomous machine-learning model. For example, and without limitation autonomous machine learning model may utilize a neural net machine-learning process, wherein the updated machine-learning model may incorporate a gradient boosting machine-learning process.

Still referring to FIG. 10, flight controller 1004 may include, be included in, and/or communicate with a mobile device such as a mobile telephone or smartphone. Further, flight controller may communicate with one or more additional devices as described below in further detail via a network interface device. The network interface device may be utilized for commutatively connecting a flight controller to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. The network may include any network topology and can may employ a wired and/or a wireless mode of communication.

In an embodiment, and still referring to FIG. 10, flight controller 1004 may include, but is not limited to, for example, a cluster of flight controllers in a first location and a second flight controller or cluster of flight controllers in a second location. Flight controller 1004 may include one or more flight controllers dedicated to data storage, security, distribution of traffic for load balancing, and the like. Flight controller 1004 may be configured to distribute one or more computing tasks as described below across a plurality of flight controllers, which may operate in parallel, in series, redundantly, or in any other manner used for distribution of tasks or memory between computing devices. For example, and without limitation, flight controller 1004 may implement a control algorithm to distribute and/or command the plurality of flight controllers. As used in this disclosure a "control algorithm" is a finite sequence of well-defined computer implementable instructions that may determine the flight component of the plurality of flight components to be adjusted. For example, and without limitation, control algorithm may include one or more algorithms that reduce and/or prevent aviation asymmetry. As a further non-limiting example, control algorithms may include one or more models generated as a function of a software including, but not limited to Simulink by MathWorks, Natick, Massachusetts, USA. In an embodiment, and without limitation, control algorithm may be configured to generate an auto-code, wherein an "auto-code," is used herein, is a code and/or algorithm that is generated as a function of the one or more models and/or software's. In another embodiment, control algorithm may be configured to produce a segmented control algorithm. As used in this disclosure a "segmented control algorithm" is control algorithm that has been separated and/or parsed into discrete sections. For example, and without limitation, segmented control algorithm may parse control algorithm into two or more segments, wherein each segment of control algorithm may be performed by one or more flight controllers operating on distinct flight components.

In an embodiment, and still referring to FIG. 10, control algorithm may be configured to determine a segmentation boundary as a function of segmented control algorithm. As used in this disclosure a "segmentation boundary" is a limit and/or delineation associated with the segments of the segmented control algorithm. For example, and without limitation, segmentation boundary may denote that a segment in the control algorithm has a first starting section and/or a first ending section. As a further non-limiting example, segmentation boundary may include one or more boundaries associated with an ability of flight component 1032. In an embodiment, control algorithm may be configured to create an optimized signal communication as a function of segmentation boundary. For example, and without limitation, optimized signal communication may include identifying the discrete timing required to transmit and/or receive the one or more segmentation boundaries. In an embodiment, and without limitation, creating optimized signal communication further comprises separating a plurality of signal codes across the plurality of flight controllers. For example, and without limitation the plurality of flight controllers may include one or more formal networks, wherein formal networks transmit data along an authority chain and/or are limited to task-related communications. As a further non-limiting example, communication network may include informal networks, wherein informal networks transmit data in any direction. In an embodiment, and without limitation, the plurality of flight controllers may include a chain path, wherein a "chain path," as used herein, is a linear communication path comprising a hierarchy that data may flow through. In an embodiment, and without limitation, the plurality of flight controllers may include an all-channel path, wherein an "all-channel path," as used herein, is a communication path that is not restricted to a particular direction. For example, and without limitation, data may be transmitted upward, downward, laterally, and the like thereof. In an embodiment, and without limitation, the plurality of flight controllers may include one or more neural networks that assign a weighted value to a transmitted datum. For example, and without limitation, a weighted value may be assigned as a function of one or more signals denoting that a flight component is malfunctioning and/or in a failure state.

Still referring to FIG. 10, the plurality of flight controllers may include a master bus controller. As used in this disclosure a "master bus controller" is one or more devices and/or components that are connected to a bus to initiate a direct memory access transaction, wherein a bus is one or more terminals in a bus architecture. Master bus controller may communicate using synchronous and/or asynchronous bus control protocols. In an embodiment, master bus controller may include flight controller 1004. In another embodiment, master bus controller may include one or more universal asynchronous receiver-transmitters (UART). For example, and without limitation, master bus controller may include one or more bus architectures that allow a bus to initiate a direct memory access transaction from one or more buses in the bus architectures. As a further non-limiting example, master bus controller may include one or more peripheral devices and/or components to communicate with another peripheral device and/or component and/or the master bus controller. In an embodiment, master bus controller may be configured to perform bus arbitration. As used in this disclosure "bus arbitration" is method and/or scheme to prevent multiple buses from attempting to communicate with and/or connect to master bus controller. For example and without limitation, bus arbitration may include one or more schemes such as a small computer interface system, wherein a small computer interface system is a set of standards for physical connecting and transferring data between peripheral devices and master bus controller by defining commands, protocols, electrical, optical, and/or logical interfaces. In an embodiment, master bus controller may receive intermediate representation 1012 and/or output language from logic component 1020, wherein output language may include one or more analog-to-digital conversions, low bit rate transmissions, message encryptions, digital signals, binary signals, logic signals, analog signals, and the like thereof described above in detail.

Still referring to FIG. 10, master bus controller may communicate with a slave bus. As used in this disclosure a "slave bus" is one or more peripheral devices and/or components that initiate a bus transfer. For example, and without limitation, slave bus may receive one or more controls and/or asymmetric communications from master bus controller, wherein slave bus transfers data stored to master bus controller. In an embodiment, and without limitation, slave bus may include one or more internal buses, such as but not limited to a/an internal data bus, memory bus, system bus, front-side bus, and the like thereof. In another embodiment, and without limitation, slave bus may include one or more external buses such as external flight controllers, external computers, remote devices, printers, aircraft computer systems, flight control systems, and the like thereof.

In an embodiment, and still referring to FIG. 10, control algorithm may optimize signal communication as a function of determining one or more discrete timings. For example, and without limitation master bus controller may synchronize timing of the segmented control algorithm by injecting high priority timing signals on a bus of the master bus control. As used in this disclosure a "high priority timing signal" is information denoting that the information is important. For example, and without limitation, high priority timing signal may denote that a section of control algorithm is of high priority and should be analyzed and/or transmitted prior to any other sections being analyzed and/or transmitted. In an embodiment, high priority timing signal may include one or more priority packets. As used in this disclosure a "priority packet" is a formatted unit of data that is communicated between the plurality of flight controllers. For example, and without limitation, priority packet may denote that a section of control algorithm should be used and/or is of greater priority than other sections.

Still referring to FIG. 10, flight controller 1004 may also be implemented using a "shared nothing" architecture in which data is cached at the worker, in an embodiment, this may enable scalability of aircraft and/or computing device. Flight controller 1004 may include a distributer flight controller. As used in this disclosure a "distributer flight controller" is a component that adjusts and/or controls a plurality of flight components as a function of a plurality of flight controllers. For example, distributer flight controller may include a flight controller that communicates with a plurality of additional flight controllers and/or clusters of flight controllers. In an embodiment, distributed flight control may include one or more neural networks. For example, neural network also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes, one or more intermediate layers, and an output layer of nodes. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 10, a node may include, without limitation a plurality of inputs $x_i$ that may receive numerical values from inputs to a neural network containing the node and/or from other nodes. Node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above. In an embodiment, and without limitation, a neural network may receive semantic units as inputs and output vectors representing such semantic units according to weights $w_i$ that are derived using machine-learning processes as described in this disclosure.

Still referring to FIG. 10, flight controller may include a sub-controller 1040. As used in this disclosure a "sub-controller" is a controller and/or component that is part of a distributed controller as described above; for instance, flight controller 1004 may be and/or include a distributed flight controller made up of one or more sub-controllers. For example, and without limitation, sub-controller 1040 may include any controllers and/or components thereof that are similar to distributed flight controller and/or flight controller as described above. Sub-controller 1040 may include any component of any flight controller as described above. Sub-controller 1040 may be implemented in any manner suitable for implementation of a flight controller as described above. As a further non-limiting example, sub-controller 1040 may include one or more processors, logic components and/or computing devices capable of receiving, processing, and/or transmitting data across the distributed flight controller as described above. As a further non-limiting example, sub-controller 1040 may include a controller that receives a signal from a first flight controller and/or first distributed flight controller component and transmits the signal to a plurality of additional sub-controllers and/or flight components.

Still referring to FIG. 10, flight controller may include a co-controller 1044. As used in this disclosure a "co-controller" is a controller and/or component that joins flight controller 1004 as components and/or nodes of a distributer flight controller as described above. For example, and without limitation, co-controller 1044 may include one or more controllers and/or components that are similar to flight controller 1004. As a further non-limiting example, co-controller 1044 may include any controller and/or component that joins flight controller 1004 to distributer flight controller. As a further non-limiting example, co-controller 1044 may include one or more processors, logic components and/or computing devices capable of receiving, processing, and/or transmitting data to and/or from flight controller 1004 to distributed flight control system. Co-controller 1044 may include any component of any flight controller as described above. Co-controller 1044 may be implemented in any manner suitable for implementation of a flight controller as described above.

In an embodiment, and with continued reference to FIG. 10, flight controller 1004 may be designed and/or configured to perform any method, method step, or sequence of method steps in any embodiment described in this disclosure, in any order and with any degree of repetition. For instance, flight controller 1004 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Flight controller may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 11:
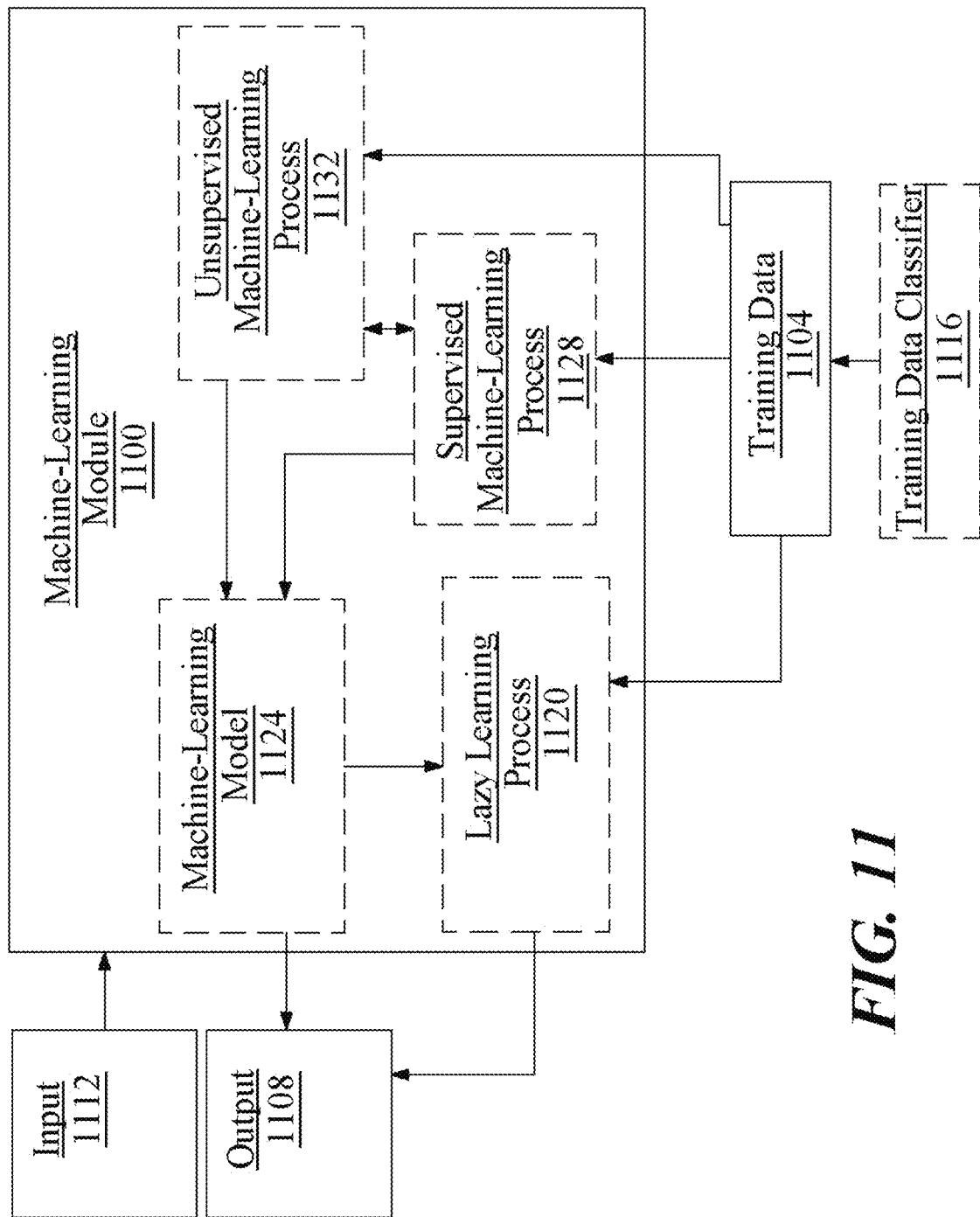
FIG. 11 is block diagram of a machine learning module.

Referring now to FIG. 11, an exemplary embodiment of a machine-learning module 1100 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 1104 to generate an algorithm that will be performed by a computing device/module to produce outputs 1108 given data provided as inputs 1112; this is in contrast to a non-machine learning software program where the commands to be executed are determined in advance by a user and written in a programming language.

Still referring to FIG. 11, "training data," as used herein, is data containing correlations that a machine-learning process may use to model relationships between two or more categories of data elements. For instance, and without limitation, training data 1104 may include a plurality of data entries, each entry representing a set of data elements that were recorded, received, and/or generated together; data elements may be correlated by shared existence in a given data entry, by proximity in a given data entry, or the like. Multiple data entries in training data 1104 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 1104 according to various correlations; correlations may indicate causative and/or predictive links between categories of data elements, which may be modeled as relationships such as mathematical relationships by machine-learning processes as described in further detail below. Training data 1104 may be formatted and/or organized by categories of data elements, for instance by associating data elements with one or more descriptors corresponding to categories of data elements. As a non-limiting example, training data 1104 may include data entered in standardized forms by persons or processes, such that entry of a given data element in a given field in a form may be mapped to one or more descriptors of categories. Elements in training data 1104 may be linked to descriptors of categories by tags, tokens, or other data elements; for instance, and without limitation, training data 1104 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 11, training data 1104 may include one or more elements that are not categorized; that is, training data 1104 may not be formatted or contain descriptors for some elements of data. Machine-learning algorithms and/or other processes may sort training data 1104 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 1104 to be made applicable for two or more distinct machine-learning algorithms as described in further detail below. Training data 1104 used by machine-learning module 1100 may correlate any input data as described in this disclosure to any output data as described in this disclosure. As a non-limiting illustrative example inputs may include battery data and outputs may include predicted battery life.

Further referring to FIG. 11, training data may be filtered, sorted, and/or selected using one or more supervised and/or unsupervised machine-learning processes and/or models as described in further detail below; such models may include without limitation a training data classifier 1116. Training data classifier 1116 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 1100 may generate a classifier using a classification algorithm, defined as a processes whereby a computing device and/or any module and/or component operating thereon derives a classifier from training data 1104. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 1116 may classify elements of training data to temperatures, voltages, currents, humidity, pressure, and the like.

Still referring to FIG. 11, machine-learning module 1100 may be configured to perform a lazy-learning process 1120 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 1104. Heuristic may include selecting some number of highest-ranking associations and/or training data 1104 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 11, machine-learning processes as described in this disclosure may be used to generate machine-learning models 1124. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 1124 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 1124 may be generated by creating an artificial neural network, such as a convolutional neural network comprising an input layer of nodes, one or more intermediate layers, and an output layer of nodes. Connections between nodes may be created via the process of "training" the network, in which elements from a training data 1104 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 11, machine-learning algorithms may include at least a supervised machine-learning process 1128. At least a supervised machine-learning process 1128, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include battery data as described above as inputs, predicted battery life as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 1104. Persons skilled in the art, upon reviewing the entirety of this disclosure, will be aware of various possible variations of at least a supervised machine-learning process 1128 that may be used to determine relation between inputs and outputs. Supervised machine-learning processes may include classification algorithms as defined above.

Further referring to FIG. 11, machine learning processes may include at least an unsupervised machine-learning processes 1132. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 11, machine-learning module 1100 may be designed and configured to create a machine-learning model 1124 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 11, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 12:
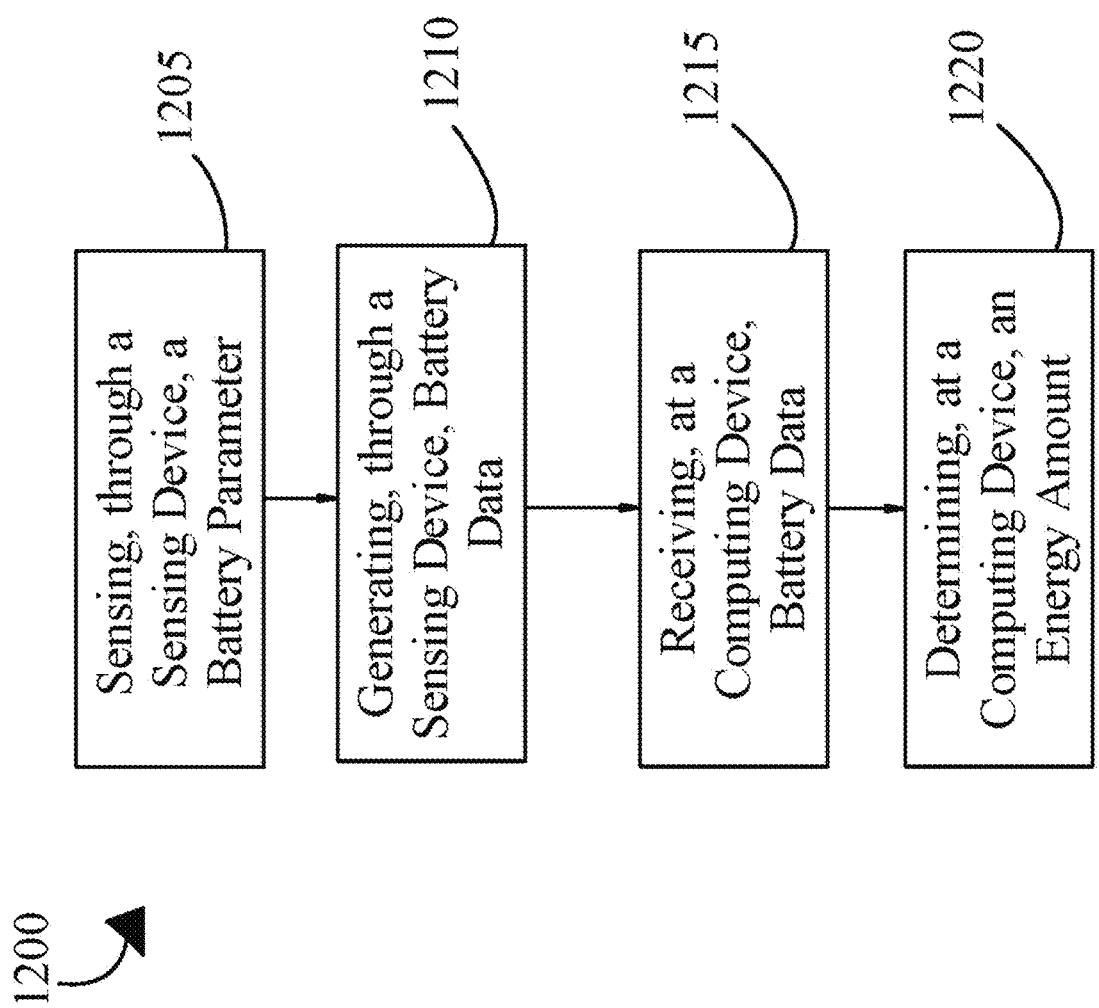
FIG. 12 is flowchart of a method of energy tracking in an electric aircraft.

Referring now to FIG. 12, method 1200 of energy tracking of an electric vehicle is presented. At step 1205, method 1200 includes sensing, through a sensing device, a battery parameter. A sensing device may include, but is not limited to, a thermometer, ohmmeter, voltmeter, and the like. A sensing device may be coupled to a battery pack and/or battery module. A sensing device may be configured to detect a battery parameter. A battery parameter may include, but is not limited to, temperature, voltage, current, power output, capacity, and the like. This step may be implemented as described above in FIGS. 1-9.

Still referring to FIG. 12, at step 1210, method 1200 includes generating, through a sensing device, battery data. Battery data may include, but is not limited to, voltages, currents, capacities, battery health, battery tun time, and the like. This step may be implemented as described in FIGS. 1-9.

Still referring to FIG. 12, at step 1215, method 1200 includes receiving, at a computing device, battery data. Battery data may be received, wirelessly, wired, or through another connection. In some embodiments, a computing device may be in electronic communication with a sensing device. A computing device may be configured to store battery data in a battery database. This step may be implemented as described in FIGS. 1-9.

Still referring to FIG. 12, at step 1220, method 1200 includes determining, at a computing device, an energy amount. An energy amount may include, but is not limited to, a current battery capacity, a predicted battery capacity, power output, remaining battery life, and the like. This step may be implemented as described in FIGS. 1-11.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 13:
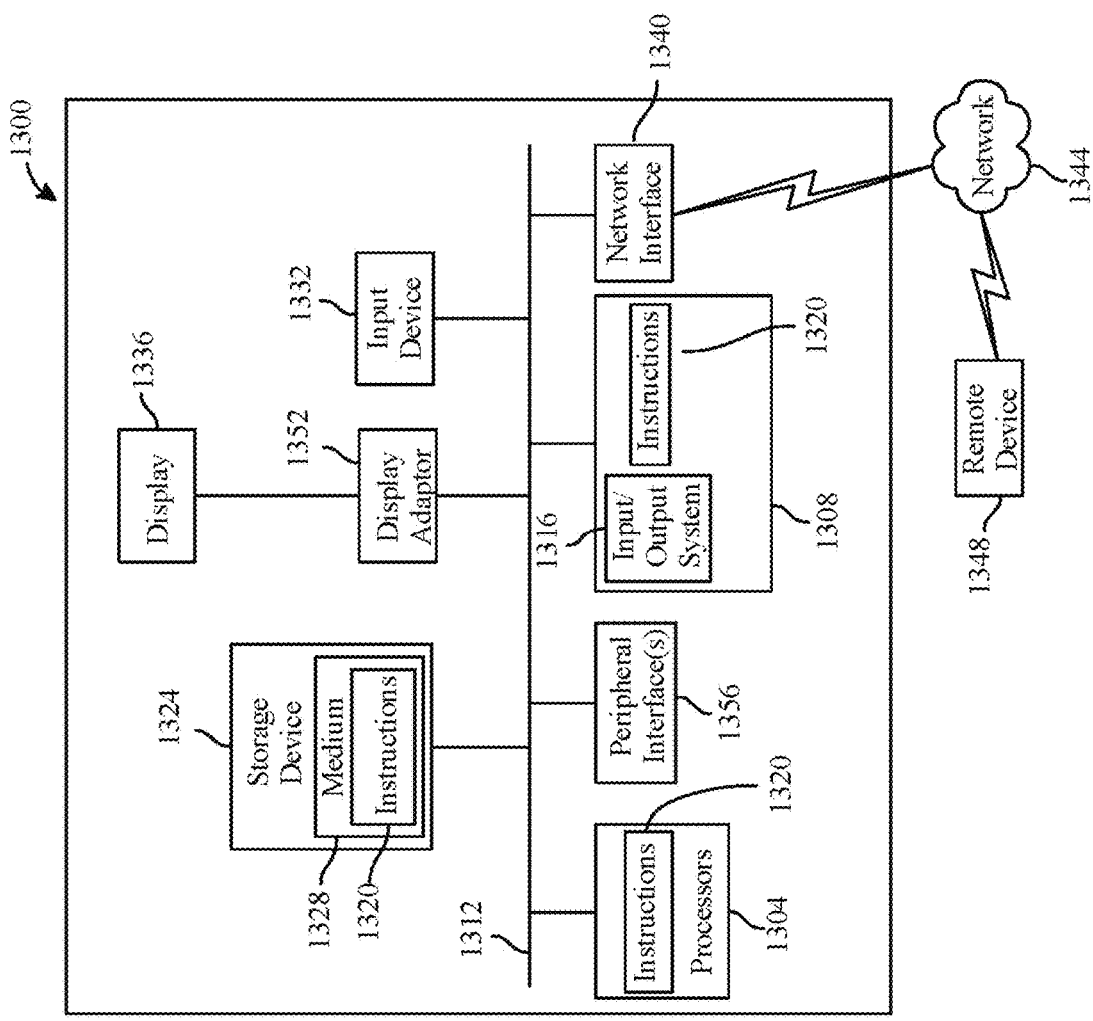
FIG. 13 is a block diagram of a computing system that can be used to implement any one or more of the methodologies disclosed herein and any one or more portions thereof.

FIG. 13 shows a diagrammatic representation of one embodiment of a computing device in the exemplary form of a computer system 1300 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 1300 includes a processor 1304 and a memory 1308 that communicate with each other, and with other components, via a bus 1312. Bus 1312 may include any of several types of bus structures including, but not limited to, a memory bus, a memory controller, a peripheral bus, a local bus, and any combinations thereof, using any of a variety of bus architectures.

Still referring to FIG. 13, processor 1304 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 1304 may be organized according to Von Neumann and/or Harvard architecture as a non-limiting example. Processor 1304 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating-point unit (FPU), and/or system on a chip (SoC).

Still referring to FIG. 13, memory 1308 may include various components (e.g., machine-readable media) including, but not limited to, a random-access memory component, a read only component, and any combinations thereof. In one example, a basic input/output system 1316 (BIOS), including basic routines that help to transfer information between elements within computer system 1300, such as during start-up, may be stored in memory 1308. Memory 1308 may also include (e.g., stored on one or more machine-readable media) instructions (e.g., software) 1320 embodying any one or more of the aspects and/or methodologies of the present disclosure. In another example, memory 1308 may further include any number of program modules including, but not limited to, an operating system, one or more application programs, other program modules, program data, and any combinations thereof.

Still referring to FIG. 13, computer system 1300 may also include a storage device 1324. Examples of a storage device (e.g., storage device 1324) include, but are not limited to, a hard disk drive, a magnetic disk drive, an optical disc drive in combination with an optical medium, a solid-state memory device, and any combinations thereof. Storage device 1324 may be connected to bus 1312 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 1324 (or one or more components thereof) may be removably interfaced with computer system 1300 (e.g., via an external port connector (not shown)). Particularly, storage device 1324 and an associated machine-readable medium 1328 may provide nonvolatile and/or volatile storage of machine-readable instructions, data structures, program modules, and/or other data for computer system 1300. In one example, software 1320 may reside, completely or partially, within machine-readable medium 1328. In another example, software 1320 may reside, completely or partially, within processor 1304.

Still referring to FIG. 13, computer system 1300 may also include an input device 1332. In one example, a user of computer system 1300 may enter commands and/or other information into computer system 1300 via input device 1332. Examples of an input device 1332 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 1332 may be interfaced to bus 1312 via any of a variety of interfaces (not shown) including, but not limited to, a serial interface, a parallel interface, a game port, a USB interface, a FIREWIRE interface, a direct interface to bus 1312, and any combinations thereof. Input device 1332 may include a touch screen interface that may be a part of or separate from display 1336, discussed further below. Input device 1332 may be utilized as a user selection device for selecting one or more graphical representations in a graphical interface as described above.

Still referring to FIG. 13, a user may also input commands and/or other information to computer system 1300 via storage device 1324 (e.g., a removable disk drive, a flash drive, etc.) and/or network interface device 1340. A network interface device, such as network interface device 1340, may be utilized for connecting computer system 1300 to one or more of a variety of networks, such as network 1344, and one or more remote devices 1348 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1344, may employ a wired and/or a wireless mode of communication. In general, any network topology may be used. Information (e.g., data, software 1320, etc.) may be communicated to and/or from computer system 1300 via network interface device 1340.

Still referring to FIG. 13, computer system 1300 may further include a video display adapter 1352 for communicating a displayable image to a display device, such as display device 1336. Examples of a display device include, but are not limited to, a liquid crystal display (LCD), a cathode ray tube (CRT), a plasma display, a light emitting diode (LED) display, and any combinations thereof. Display adapter 1352 and display device 1336 may be utilized in combination with processor 1304 to provide graphical representations of aspects of the present disclosure. In addition to a display device, computer system 1300 may include one or more other peripheral output devices including, but not limited to, an audio speaker, a printer, and any combinations thereof. Such peripheral output devices may be connected to bus 1312 via a peripheral interface 1356. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A system for energy tracking in an electric aircraft, comprising:
    a battery pack including a plurality of battery modules;
    a sensing device configured to:
        detect a battery parameter of a battery module of the plurality of battery modules; and
        generate battery data as a function of the battery parameter; and
    a computing device communicatively connected to the sensing device and configured to:
        receive the battery data from the sensing device;
        determine a power distribution of the at least a battery module by determining whether the battery module is generating power at an uneven rate compared to the plurality of battery modules; and
        determine a remaining battery life for the battery pack as a function of the battery data and an energy saving machine learning model.

2. The system of claim 1, wherein the computing device is further configured to compare first battery data of a first battery module of the battery pack to second battery data of a second battery module of the battery pack.

3. The system of claim 1, wherein the computing device is further configured to determine a remaining hover time of the electric aircraft as a function of the battery data.

4. The system of claim 3, wherein the computing device is further configured to display the remaining hover time through a graphical user interface.

5. The system of claim 1, wherein the computing device is further configured to determine an energy anomaly of the battery pack as a function of the battery data.

6. The system of claim 1, wherein the energy saving machine learning model comprises a scoring function representing a desired form of relationship to be detected between inputs and outputs of the energy saving machine learning model.

7. The system of claim 1, wherein the computing device is further configured to predict the remaining battery life as a function of a flight maneuver.

8. The system of claim 1, wherein the computing device is further configured to predict a remaining battery life of a battery module of the battery pack.

9. A method of energy tracking in an electric aircraft, comprising:
    sensing, through a sensing device of an electric aircraft, a battery parameter of a battery module of a plurality of battery modules;
    generating, through the sensing device, battery data as a function of the battery parameter of the battery module;
    receiving, at a computing device of an electric aircraft, battery data from the sensing device;
    determining, by the computing device, a power distribution of the battery module by determining whether the battery module is generating power at an uneven rate compared to the plurality of battery modules; and
    determining, by the computing device, a remaining battery life for the plurality of battery modules as a function of the battery data and an energy saving machine learning model.

10. The method of claim 9, further comprising:
    comparing battery data of a first battery module of the plurality of battery modules to a second battery module of the plurality of battery modules.

11. The method of claim 9, further comprising:
    determining a remaining hover time of the electric aircraft as a function of the battery data.

12. The method of claim 11, further comprising:
    displaying the remaining hover time through a graphical user interface.

13. The method of claim 9, further comprising:
    determining an energy anomaly of the plurality of battery modules as a function of the battery data.

14. The method of claim 9, wherein determining the remaining battery life further includes using a scoring function representing a desired form of relationship to be detected between inputs and outputs of the energy saving machine learning model.

15. The method of claim 9, wherein determining the remaining battery life further includes predicting the remaining battery life as a function of at least a flight maneuver.

16. The method of claim 9, further comprising:
    determining a remaining battery life of a battery module of the plurality of battery modules as a function of the battery data.

* * * * *